US012660685B2

(12) United States Patent
Baek et al.

(10) Patent No.: US 12,660,685 B2
(45) Date of Patent: Jun. 16, 2026

(54) DISPLAY DEVICE

(71) Applicant: Samsung Display Co., LTD., Yongin-si (KR)

(72) Inventors: Sung Eun Baek, Suwon-si (KR); Jin Woo Choi, Seoul (KR); Joo Woan Cho, Seongnam-si (KR); Sung Kook Park, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 594 days.

(21) Appl. No.: 17/735,832

(22) Filed: May 3, 2022

(65) Prior Publication Data

US 2023/0095842 A1 Mar. 30, 2023

(30) Foreign Application Priority Data

Sep. 15, 2021 (KR) ........................ 10-2021-0122918

(51) Int. Cl.
*H10W 90/00* (2026.01)
*B60K 35/22* (2024.01)
(Continued)

(52) U.S. Cl.
CPC ............. *H10W 90/00* (2026.01); *B60K 35/22* (2024.01); *B60K 35/50* (2024.01); *B60K 35/60* (2024.01); *H10H 20/812* (2025.01); *H10H 20/8162* (2025.01); *H10H 20/841* (2025.01); *H10H 20/851* (2025.01); *H10H 20/856* (2025.01); *H10H 20/857* (2025.01); *H10H 29/142* (2025.01); *G06F 1/163* (2013.01)

(58) Field of Classification Search
CPC ....... H01L 25/13; H01L 27/156; H01L 33/06; H01L 33/145; H01L 33/46; H01L 33/50; H01L 33/60; H01L 33/62; B60K 35/00; G06F 1/163
See application file for complete search history.

(56) References Cited

U.S. PATENT DOCUMENTS

| | | | | |
|---|---|---|---|---|
| 2004/0169824 A1* | 9/2004 | Newell | ................ | H04N 9/3167 |
| | | | | 353/30 |
| 2005/0146686 A1* | 7/2005 | Pentico | ................ | H04N 9/3105 |
| | | | | 348/E9.027 |

(Continued)

FOREIGN PATENT DOCUMENTS

| | | |
|---|---|---|
| KR | 10-2014-0096604 A | 8/2014 |
| KR | 2019-0043828 A | 4/2019 |
| KR | 2022-0149889 A | 11/2022 |

OTHER PUBLICATIONS ip.com search attached (Year: 2026).*

*Primary Examiner* — Zandra V Smith
*Assistant Examiner* — Andre C Stevenson
(74) *Attorney, Agent, or Firm* — Womble Bond Dickinson (US) LLP

(57) ABSTRACT

A display device includes a circuit board including a first circuit portion, a second circuit portion, and a third circuit portion, a first display panel on the first circuit portion, and configured to emit a first light, a second display panel on the second circuit portion, and configured to emit a second light, a third display panel on the third circuit portion, and configured to emit a third light, and an optical combiner configured to combine the first light, the second light, and the third light to output a light.

10 Claims, 31 Drawing Sheets

(51) Int. Cl.

| | |
|---|---|
| *B60K 35/50* | (2024.01) |
| *B60K 35/60* | (2024.01) |
| *G06F 1/16* | (2006.01) |
| *H10H 20/812* | (2025.01) |
| *H10H 20/816* | (2025.01) |
| *H10H 20/841* | (2025.01) |
| *H10H 20/851* | (2025.01) |
| *H10H 20/856* | (2025.01) |
| *H10H 20/857* | (2025.01) |
| *H10H 29/14* | (2025.01) |

(56) References Cited

U.S. PATENT DOCUMENTS

| | | | |
|---|---|---|---|
| 2014/0267937 A1 | 9/2014 | Raring et al. | |
| 2019/0056464 A1 | 2/2019 | Foley et al. | |
| 2019/0305255 A1* | 10/2019 | Koshihara | G02B 27/149 |
| 2020/0278558 A1* | 9/2020 | Yamamoto | G03B 21/00 |
| 2024/0170625 A1* | 5/2024 | Liu | H10H 20/855 |
| 2025/0060518 A1* | 2/2025 | Yaguchi | B82Y 40/00 |

* cited by examiner

CB : CB1,CB2,CB3,CB4

CB : CB1,CB2,CB3,CB4

CB : CB1,CB2,CB3,CB4

DISPLAY DEVICE

CROSS-REFERENCE TO RELATED APPLICATION

This application claims priority to, and the benefit of, Korean Patent Application No. 10-2021-0122918 filed on Sep. 15, 2021 in the Korean Intellectual Property Office, the disclosure of which is incorporated herein by reference in its entirety.

BACKGROUND

1. Field

The disclosure relates to a display device.

2. Description of the Related Art

As the information-oriented society evolves, various demands for display devices are ever increasing. Display devices may be flat panel display devices, such as a liquid-crystal display device, a field emission display device, and a light-emitting display device. Light-emitting display devices may include an organic light-emitting display device, which includes organic light-emitting diodes as the light-emitting elements, an inorganic light-emitting display device, which includes inorganic semiconductor elements as the light-emitting elements, and a micro-LED display device, which includes light-emitting diodes as the light-emitting elements.

Recently, a head mounted display including a light-emitting display device has been developed. A head mounted display (HMD) is a glasses-type monitor device providing virtual reality (VR) or augmented reality (AR) that is worn on a user's body in the form of glasses or a helmet to form a focus close to the user's eyes.

A high-resolution micro-LED display panel including micro light-emitting diodes is applied to head mounted displays. Micro-LED display panels may be used to implement a mono-color or full-color display.

SUMMARY

Aspects of the disclosure provide a display device capable of realizing a full-color display using a plurality of light-emitting diode display panels implementing different mono-color displays.

This and other aspects and embodiments of the disclosure will become apparent to those of ordinary skill in the art upon review of the Detailed Description and Claims to follow.

According to some embodiments of the disclosure, a display device includes a circuit board including a first circuit portion, a second circuit portion, and a third circuit portion, a first display panel on the first circuit portion, and configured to emit a first light, a second display panel on the second circuit portion, and configured to emit a second light, a third display panel on the third circuit portion, and configured to emit a third light, and an optical combiner configured to combine the first light, the second light, and the third light to output a light.

The circuit board may further include a bendable first connection portion between the first circuit portion and the second circuit portion, and a bendable second connection portion between the second circuit portion and the third circuit portion.

The optical combiner may include a first reflective/transmissive film that is configured to reflect the first light of the first display panel, and that is configured to transmit the second and third lights, and a second reflective/transmissive film that is configured to reflect the third light of the third display panel, and that is configured to transmit the first light and the second light.

The first display panel may be on a first side surface of the optical combiner, wherein the second display panel is on a second side surface of the optical combiner, wherein the third display panel is on a third side surface of the optical combiner facing the first side surface.

A thickness of the first circuit portion, a thickness of the second circuit portion, and a thickness of the third circuit portion may be different from one another.

The thickness of the first circuit portion may be smaller than the thickness of the second circuit portion, and the thickness of the second circuit portion may be less than the thickness of the third circuit portion.

The display device may further include a first circuit board layer in the first circuit portion, the second circuit portion, the third circuit portion, the first connection portion, and the second connection portion, a second circuit board layer in the second circuit portion, the third circuit portion, and the second connection portion, and a third circuit board layer in the third circuit portion.

The first circuit board layer might not be covered by the second circuit board layer, but is exposed, in the first circuit portion and the first connection portion, wherein the second circuit board layer is not covered by the third circuit board layer, but is exposed, in the second circuit portion and the second connection portion.

The first display panel may be on the first circuit board layer, the second display panel is on the second circuit board layer, and the third display panel is on the third circuit board layer.

The first circuit board layer may include a first base layer, a first conductive layer on the first base layer and including first conductive lines, and a first insulating layer on the first conductive layer, wherein the second circuit board layer includes a second base layer, a second conductive layer on the second base layer and including second conductive lines, and a first insulating layer on the first conductive layer, and wherein the third circuit board layer includes a third base layer, a third conductive layer on the third base layer and including third conductive lines, and a third insulating layer on the third conductive layer.

The circuit board may further include a fourth circuit portion defining a first via hole penetrating through the first insulating layer, the second insulating layer, the second conductive layer, the third insulating layer, and the third conductive layer, a second via hole penetrating through the second insulating layer, the third insulating layer, and the third conductive layer, and a third via hole penetrating through the third insulating layer.

The first connection portion and the second connection portion may have a serpentine structure when viewed from top.

The first circuit portion, the second circuit portion, and the third circuit portion may further include a rigid support member, wherein the first connection portion and the second connection portion are flexible.

According to other embodiments of the disclosure, a display device includes a first display panel configured to emit a first light, a second display panel configured to emit a second light, a third display panel configured to emit a third light, a first circuit board layer including first conductive lines connected to the first display panel, a second circuit board layer including second conductive lines connected to the second display panel, and a third circuit board layer including third conductive lines connected to the third display panel, wherein the first circuit board layer, the second circuit board layer, and the third circuit board layer are sequentially stacked on one another.

The first circuit board layer may overlap with the first display panel where it is not covered by the second circuit board layer, wherein the second circuit board layer overlaps with the second display panel where it is not covered by the third circuit board layer.

The display device may further include a circuit board including a first circuit pad connected to first conductive lines, wherein the first display panel includes a first pad area, and wherein circuit pads in the first circuit pad area are electrically connected to pads in the first pad area.

The first display panel may include a semiconductor circuit layer including pixel circuits, and a light-emitting element layer on the semiconductor circuit layer, and including light-emitting elements.

According to other embodiments of the disclosure, a display device includes a circuit board including a first circuit portion, a second circuit portion, a third circuit portion, a bendable first connection portion between the first circuit portion and the second circuit portion, and a bendable second connection portion between the second circuit portion and the third circuit portion, a first display panel on the first circuit portion, and configured to emit a first light, a second display panel on the second circuit portion, and configured to emit a second light, and a third display panel on the third circuit portion, and configured to emit a third light.

The circuit board may further include a fourth circuit portion connected to the third circuit portion, wherein the first circuit portion, the second circuit portion, the third circuit portion, and the fourth circuit portion are sequentially arranged in a first direction.

The circuit board may further include a fourth circuit portion connected on one side of the second circuit portion, wherein the first circuit portion, the second circuit portion, and the third circuit portion are arranged in a first direction, and wherein the second circuit portion and the fourth circuit portion are arranged in a second direction that is substantially perpendicular to the first direction.

According to the embodiments of the disclosure, a full-color display may be implemented using a plurality of light-emitting diode display panels implementing different mono-color displays.

In addition, because different mono-color displays are arranged on a circuit board including a flexible connection portion, it is possible to reduce the size and weight of the display device and to save the cost of the display device.

It should be noted that aspects of the disclosure are not limited to those described above and other aspects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION

Figure 1:
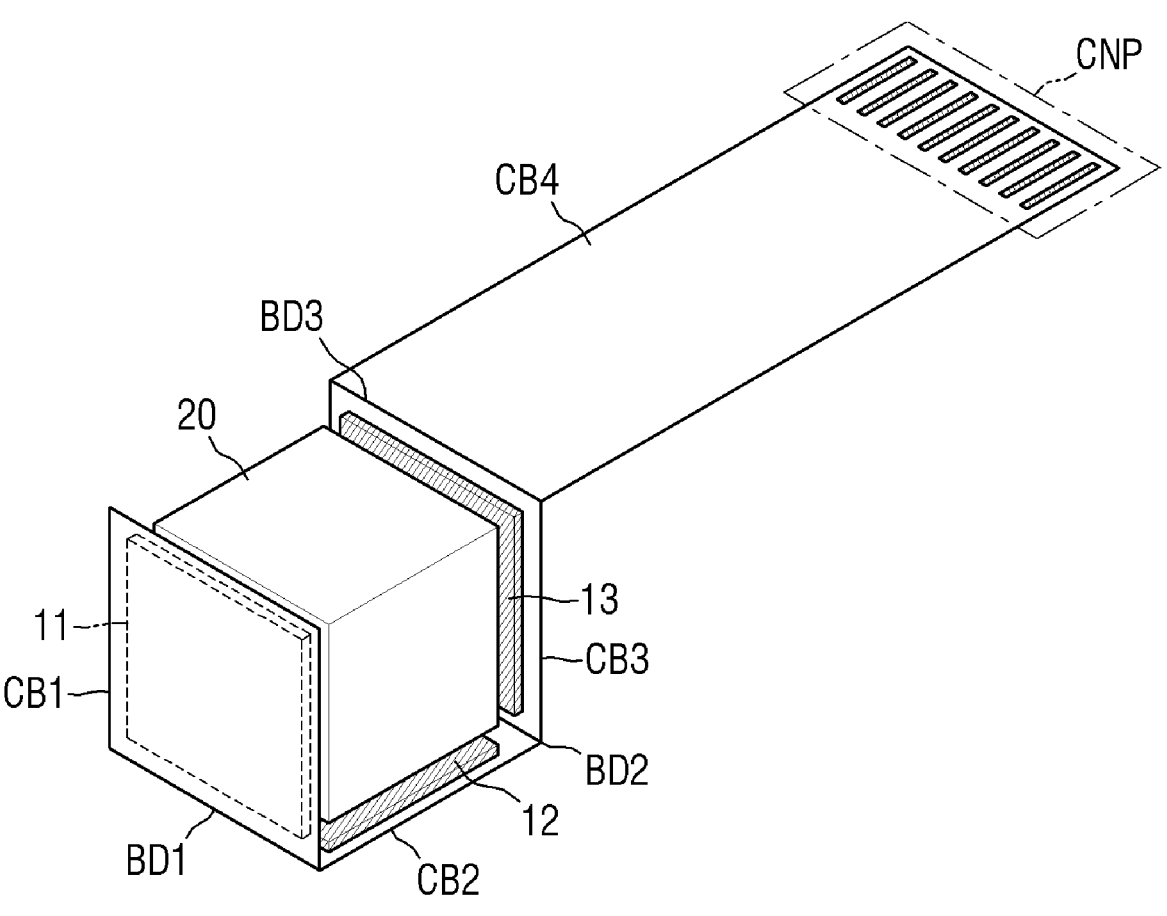
FIG. 1 is a side view of a display device according to some embodiments of the disclosure.
Figure 1:
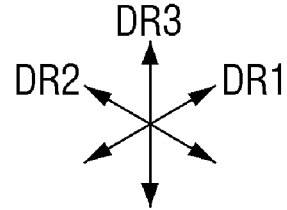

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it may be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it may be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it may be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132 (a).

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
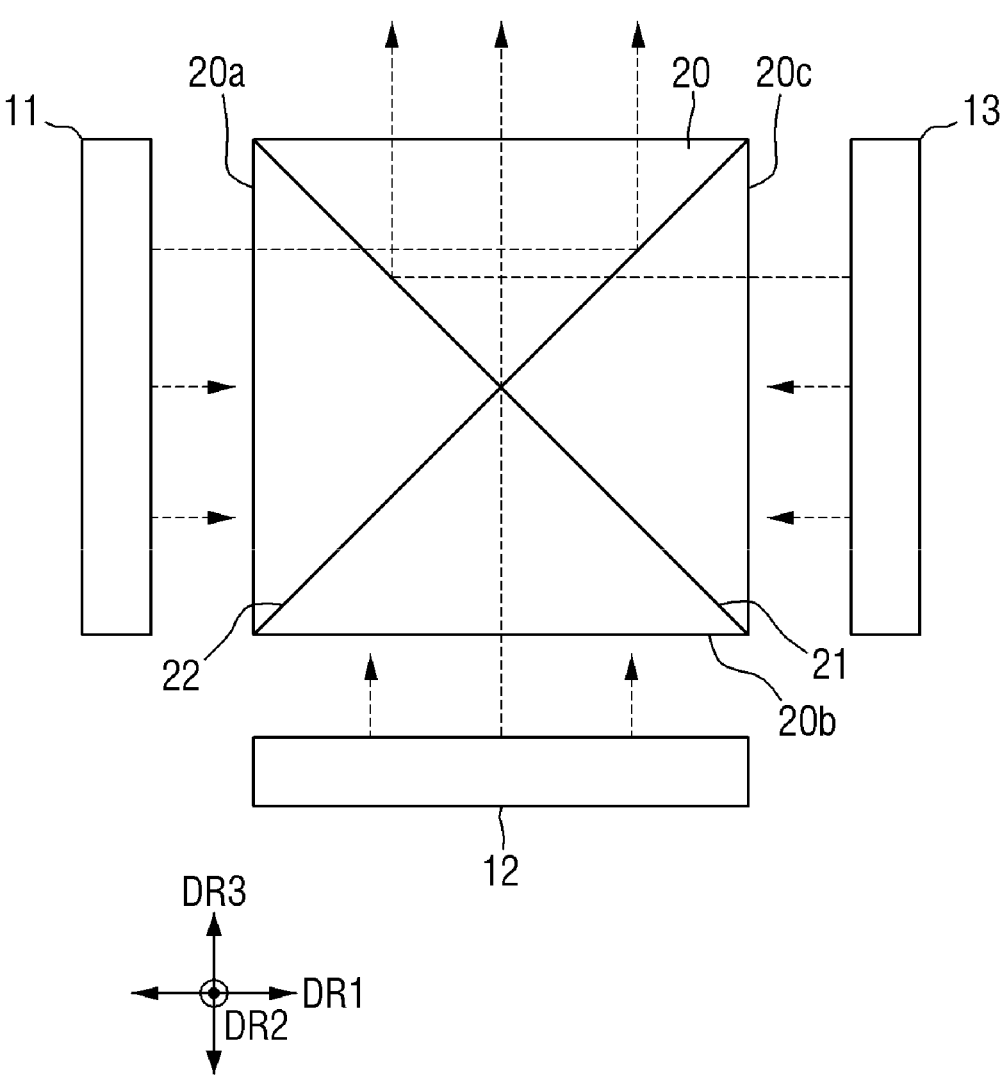
FIG. 2 is a side view of the display device of FIG. 1.
Figure 3:
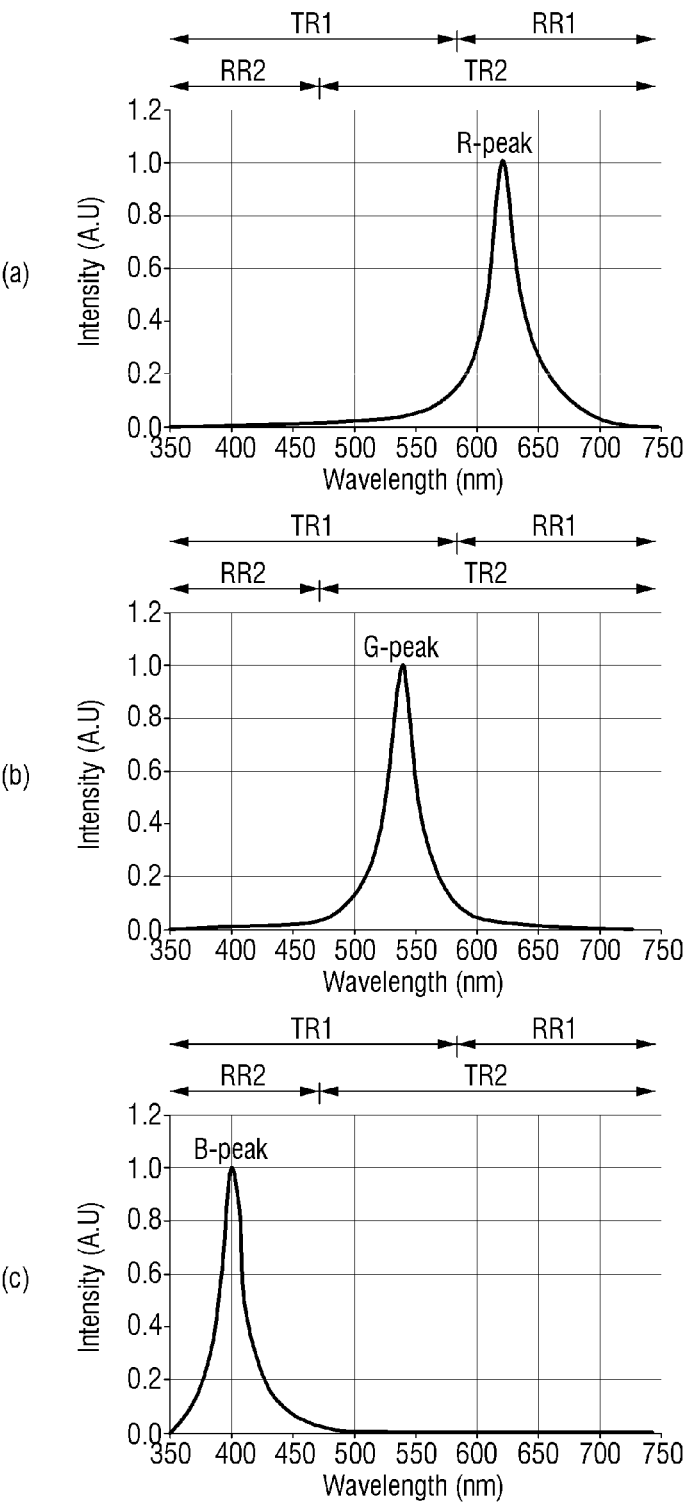
FIG. 3 depicts graphs showing examples of main peak wavelengths of first to third lights and ranges of first and second reflective/transmissive films.

FIG. 1 is a side view of a display device according to some embodiments of the disclosure. FIG. 2 is a side view of the display device of FIG. 1. FIG. 3 depicts graphs showing examples of main peak wavelengths of first to third lights and ranges of first and second reflective/transmissive films. In the example shown in FIG. 1, the display device according to some embodiments is a micro or nano light-emitting diode display device including a micro or nano light-emitting diode as a light-emitting element. It should be understood, however, that the disclosure is not limited thereto. In addition, in the example shown in FIG. 1, the display device according to some embodiments is implemented as a light-emitting diode on silicon (LEDoS) micro-display (e.g., light-emitting diodes are located on a semiconductor circuit board formed via a semiconductor process using a silicon wafer). It should be understood, however, that embodiments of the disclosure are not limited thereto.

In FIG. 1, a first direction DR1 refers to the horizontal direction of a second display panel 12, a second direction DR2 refers to the vertical direction of the second display panel 12, and a third direction DR3 refers to the thickness direction of the second display panel 12 or the thickness direction of a semiconductor circuit layer 120 of the second display panel 12. As used herein, the terms "left," "right," "upper," and "lower" sides indicate relative positions when the second display panel 12 is viewed from the top. For example, the right side refers to one side in the first direction DR1, the left side refers to the other side in the first direction DR1, the upper side refers to one side in the second direction DR2, and the lower side refers to the other side in the second direction DR2. In addition, the upper portion refers to the side indicated by the arrow of the third direction DR3, while the lower portion refers to the opposite side in the third direction DR3.

Referring to FIGS. 1 and 2, the display device 1 according to some embodiments may include display panels 10, a circuit board CB, and an optical combiner 20.

The display panels 10 may have a rectangular shape when viewed from the top. It should be understood, however, that the shape of the display panels 10 when viewed from the top is not limited thereto. It may have a polygonal, circular, oval, or irregular shape other than the rectangular shape when viewed from the top.

The display panels 10:11, 12, and 13 may include a first display panel 11 that emits a first light, a second display panel 12 that emits a second light, and a third display panel 13 that emits a third light. Each of the display panels 11, 12, and 13 may emit a mono-color light.

The first display panel 11 may emit a first light. The first light of the first display panel 11 may be light in the red wavelength range. The red wavelength range may be, but is not limited to, about 600 nm to about 750 nm (R-peak in graph (a) of FIG. 3).

The second display panel 12 may emit a second light. The second light of the second display panel 12 may be light in the green wavelength range. The green wavelength range may be, but is not limited to, about 480 nm to about 560 nm (G-peak in graph (b) of FIG. 3).

The third display panel 13 may emit a third light. The third light of the third display panel 13 may be light in the blue wavelength range. The blue wavelength range may be, but is not limited to, about 370 nm to about 460 nm (B-peak in graph (c) of FIG. 3).

The circuit board CB may be located on the rear surface of the display panels 10. The circuit board CB may be attached to the rear surface of the display panels 10 through one of an adhesive sheet, a liquid adhesive, a pressure-sensitive adhesive, and a double-sided tape. It should be understood, however, that the disclosure is not limited thereto.

The circuit board CB may include a first circuit portion CB1, a second circuit portion CB2, a third circuit portion CB3, and a fourth circuit portion CB4, and may include a first connection portion BD1, a second connection portion BD2, and a third connection portion BD3 located therebetween.

The first display panel 11 may be located on the first circuit portion CB1 of the circuit board CB. The first circuit portion CB1 may be adjacent to a first side surface 20a of the optical combiner 20. Accordingly, the first circuit portion CB1, the first display panel 11, and the first side surface 20a of the optical combiner 20 may be arranged in the first direction DR1.

The second display panel 12 may be located on the second circuit portion CB2 of the circuit board CB. The second circuit portion CB2 may be adjacent to a second side surface 20b of the optical combiner 20. Accordingly, the second circuit portion CB2, the second display panel 12, and the second side surface 20b of the optical combiner 20 may be arranged in the third direction DR3.

The third display panel 13 may be located on the third circuit portion CB3 of the circuit board CB. The third circuit portion CB3 may be adjacent to a third side surface 20c of the optical combiner 20. Accordingly, the third circuit portion CB3, the third display panel 13, and the third side surface 20c of the optical combiner 20 may be arranged in the first direction DR1.

The fourth circuit portion CB4 of the circuit board CB may be connected to an external connector. The fourth circuit portion CB4 may include a connector coupler CNP. The connector coupler CNP may provide a space for electrically connecting an external connector with a plurality of conductive lines RL (see FIG. 6) included in the circuit board CB.

The first to third connection portions BD1, BD2, and BD3 of the circuit board CB may be bending portions that may be suitably folded or bent when viewed from the top.

The first connection portion BD1 may be located between the first circuit portion CB1 and the second circuit portion CB2 to connect the first circuit portion CB1 with the second circuit portion CB2. When the first connection portion BD1 is bent, the first display panel 11 located on the first circuit portion CB1, and the second display panel 12 located on the second circuit portion CB2, may face in different directions. For example, as shown in FIG. 2, the upper surface of the first display panel 11 may be located to face the first side surface 20a of the optical combiner 20, and the upper surface of the second display panel 12 may be located to face the second side surface 20b of the optical combiner 20.

Because the first connection portion BD1 may be bent at a substantially right angle, the first display panel 11 and the second display panel 12 may extend such that they are substantially perpendicular to each other.

The second connection portion BD2 of the circuit board CB may be located between the second circuit portion CB2 and the third circuit portion CB3 to connect the second circuit portion CB2 with the third circuit portion CB3. When the second connection portion BD2 is bent, the second display panel 12 located on the second circuit portion CB2, and the third display panel 13 located on the third circuit portion CB3, may face in different directions. For example, as shown in FIG. 2, the upper surface of the third display panel 13 is located to face the third side surface 20c of the optical combiner 20, and thus the second display panel 12 and the third display panel 13 may extend such that they are substantially perpendicular to each other.

The third connection portion BD3 of the circuit board CB may be located between the third circuit portion CB3 and the fourth circuit portion CB4, and the third connection portion BD3 may connect the third circuit portion CB3 with the fourth circuit portion CB4.

The first circuit portion CB1, the second circuit portion CB2, the third circuit portion CB3, and the fourth circuit portion CB4 may form the single circuit board CB by the first to third connection portions BD1, BD2, and BD3. The first circuit portion CB1, the second circuit portion CB2, the third circuit portion CB3, and the fourth circuit portion CB4 may be arranged sequentially in the first direction DR1.

The circuit board CB may be a flexible film, such as a flexible printed circuit board (FPCB), a printed circuit board (PCB), a flexible printed circuit (FPC) and a chip-on-film (COF).

The optical combiner 20 may be surrounded (e.g., partially surrounded, or surrounded in plan view) by the first circuit portion CB1, the second circuit portion CB2, and the third circuit portion CB3 of the circuit board CB, and may be surrounded by the first display panel 11, the second display panel 12, and the third display panel 13 on the circuit board CB.

The optical combiner 20 may be in the form of a rectangular parallelepiped, a cube, or the like, in which four triangular prisms are combined. The optical combiner 20 may include the first side surface 20a facing the first display panel 11, the second side surface 20b facing the second display panel 12, and the third side surface 20c facing the third display panel 13 when viewed from the top.

The first side surface 20a of the optical combiner 20 and the third side surface 20c of the optical combiner 20 may extend in the third direction DR3 when viewed from the top, and may face each other. The first side surface 20a of the optical combiner 20 and the third side surface 20c of the optical combiner 20 may extend in the direction that is substantially perpendicular to the second side surface 20b of the optical combiner 20.

The optical combiner 20 may be an optical means that converges the first to third lights of the first to third display panels 11, 12, and 13 into one point to combine them into one. The first light of the first display panel 11 may be normally incident on (e.g., substantially normal to) the first side surface 20a of the optical combiner 20, the second light of the second display panel may be normally incident on the second side surface 20b of the optical combiner 20, and the third light of the third display panel 13 may be normally incident on the third side surface 20c of the optical combiner 20.

The optical combiner 20 may include a first reflective/transmissive film 21 and a second reflective/transmissive film 22.

As shown in FIG. 3, the first reflective/transmissive film 21 may have a first reflection range RR1 and a first transmission range TR1. The first reflective/transmissive film 21 may reflect the first light having a wavelength value within the first reflection range RR1, and may transmit other lights having wavelength values within the first transmission range TR1 (e.g., the second light and the third light).

The second reflective/transmissive film 22 may have a second reflection range RR2 and a second transmission range TR2. The second reflective/transmissive film 22 may reflect the third light having a wavelength value within the second reflection range RR2, and may transmit other lights having wavelength values within the second transmission range TR2 (e.g., the first light and the second light).

The first light incident on the first side surface 20a of the optical combiner 20 may pass through the second reflective/transmissive film 22, and may be reflected off the first reflective/transmissive film 21. The third light incident on the third side surface 20c of the optical combiner 20 may pass through the first reflective/transmissive film 21, and may be reflected off the second reflective/transmissive film 22. Because the first reflective/transmissive film 21 and the second reflective/transmissive film 22 of the optical combiner 20 do not reflect the second light, the second light incident on the second side surface 20b of the optical combiner 20 may pass through them to propagate. In this manner, the first to third lights may be focused by the optical combiner 20 so that they may be output as white light.

In the display device 1 according to some embodiments, mono-color lights emitted from the first to third display panels 11, 12, and 13 are focused in the optical combiner 20 to implement multi-color light display.

In addition, as the first to third display panels 11, 12, and 13 are located on the single circuit board CB, the size of the display device 1 may be reduced, and thus may be carried (e.g., may be portable), and the cost of the circuit board CB may be reduced.

Hereinafter, the display device 1 will be described when it is unfolded without bending the circuit board CB except for the optical combiner 20.

Figure 4:
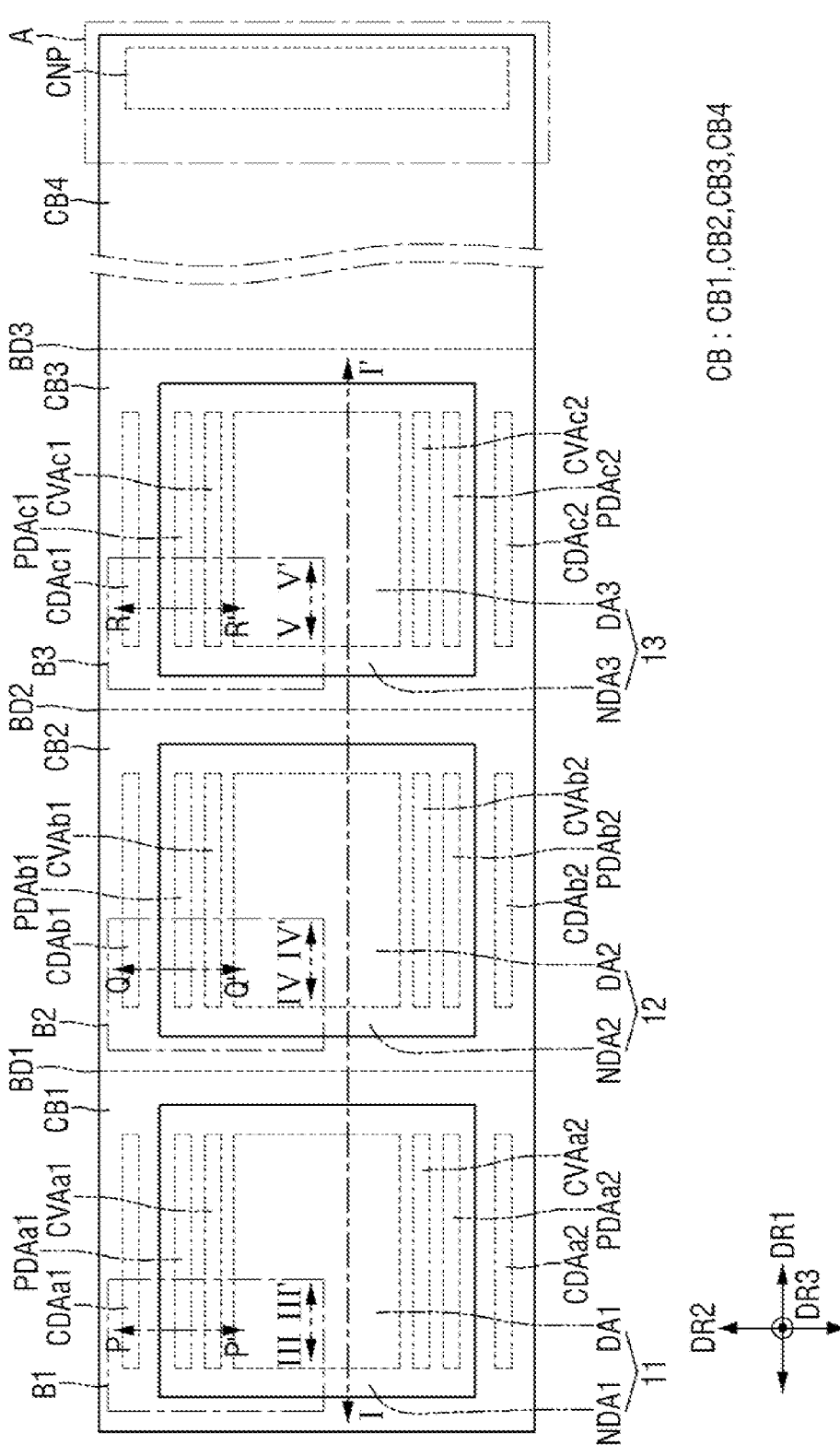
FIG. 4 is a plan view of a display device according to some embodiments of the disclosure.
Figure 5:
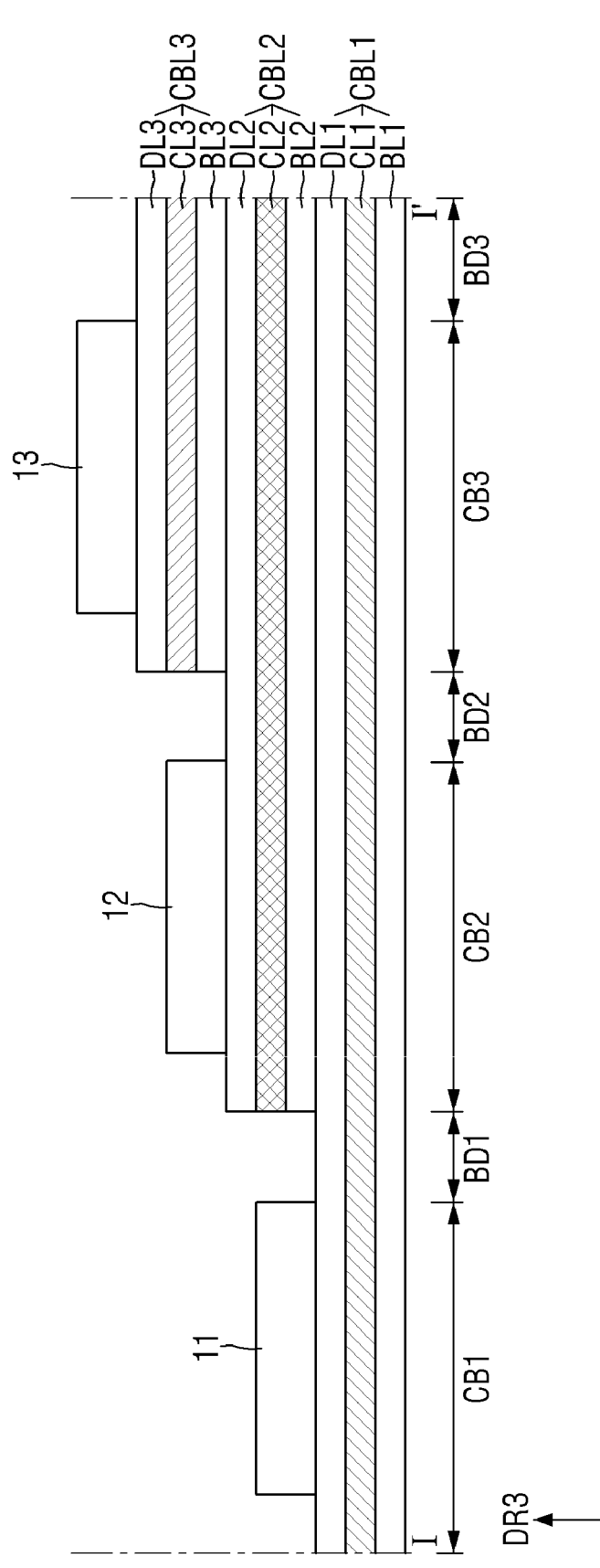
FIG. 5 is a cross-sectional view showing an example of the display panel taken along the line I-I' of FIG. 4.

FIG. 4 is a plan view of a display device according to some embodiments of the disclosure. FIG. 5 is a cross-sectional view showing an example of the display panel taken along the line I-I' of FIG. 4.

The first display panel 11, the second display panel 12, and the third display panel 13 may be arranged sequentially in the first direction DR1 on the first circuit portion CB1, the second circuit portion CB2, and the third circuit portion CB3 of the circuit board CB of the display device 1, respectively.

Each of the display panels 11, 12, and 13 may include a display area DA and a non-display area NDA.

In the display area DPA, images may be displayed. In the non-display area NDA, there may be no image displayed. Although the display area DA has a rectangular shape when viewed from the top in the example shown in the drawings, the disclosure is not limited thereto. The non-display area NDA may be located around the display area DA. The non-display area NDA may surround the display area DA.

For example, the first display panel 11 may include a first display area DA1 and a first non-display area NDA1, the second display panel 12 may include a second display area DA2 and a second non-display area NDA2, and the third display panel 13 may include a third display area DA3 and a third non-display area NDA3.

Referring to FIG. 5, the circuit board CB located on the rear surface of the first to third display panels 11, 12, and 13 may be implemented as a stack of multiple layers, and may have different stack structures for different connection portions with the respective connection portions.

For example, the circuit board CB may include a first circuit board layer CBL1, a second circuit board layer CBL2 located on the first circuit board layer CBL1, and a third circuit board layer CBL3 located on the second circuit board layer CBL2.

The first circuit board layer CBL1 may be located in the first circuit portion CB1, the second circuit portion CB2, the third circuit portion CB3, the fourth circuit portion CB4, the first connection portion BD1, the second connection portion BD2, and the third connection portion BD3.

The second circuit board layer CBL2 may be located on the first circuit board layer CBL1 in the second circuit portion CB2, the third circuit portion CB3, the fourth circuit portion CB4, the second connection portion BD2 and the third connection portion BD3. In other words, the second circuit board layer CBL2 might not be located in the first circuit portion CB1 or the first connection portion BD1.

The third circuit board layer CBL3 may be located on the second circuit board layer CBL2 in the third circuit portion CB3, the fourth circuit portion CB4, and the third connection portion BD3. In other words, the third circuit board layer CBL3 might not be located in the first circuit portion CB1, the second circuit portion CB2, the first connection portion BD1, or the second connection portion BD2.

The first circuit board layer CBL1 may not be covered by (e.g., not completely covered by) the second circuit board layer CBL2 or the third circuit board layer CBL3, but instead may be exposed in the first circuit portion CB1. The first display panel 11 may be located on the exposed first circuit board layer CBL1.

The second circuit board layer CBL2 may not be covered by (e.g., not completely covered by) the third circuit board layer CBL3, but instead may be exposed in the second circuit portion CB2. The second display panel 12 may be located on the exposed second circuit board layer CBL2.

The third circuit board layer CBL3 may be exposed so that the third display panel 13 is located in the third circuit portion CB3.

In other words, the first display panel 11 may be located on the first circuit board layer CBL1 in the first circuit portion CB1, the second display panel 12 may be located on the second circuit board layer CBL2 in the second circuit portion CB2, and the third display panel 13 may be located on the third circuit board layer CBL3 in the third circuit portion CB3.

Accordingly, the first circuit portion CB1, the second circuit portion CB2, and the third circuit portion CB3 may have different thicknesses. The first circuit board layer CBL1 may be located in the first circuit portion CB1, the first circuit board layer CBL1 and the second circuit board layer CBL2 may be located in the second circuit portion CB2, and the first circuit board layer CBL1, the second circuit board layer CBL2 and the third circuit board layer CBL3 may be located in the third circuit portion CB3. Accordingly, the thickness of the first circuit portion CB1 may be less than the thickness of the second circuit portion CB2, and the thickness of the second circuit portion CB2 may be less than the thickness of the third circuit portion CB3.

The first circuit board layer CBL1 may include a first base layer BL1, a first conductive layer CL1 located on the first base layer BL1, and a first insulating layer DL1 located on the first conductive layer CL1.

The first base layer BL1 may be made of a flexible material. For example, the first base layer BL1 may include, but is not limited to, one of polyimide, polyester, poly phenylene vinylene, and polyethylene terephthalate (PET). Accordingly, the circuit board CB may have flexibility so that it may be bent or folded.

The first conductive layer CL1 may be located on the first base layer BL1. The first conductive layer CL1 may include a plurality of first conductive lines RL1. Each of the plurality of first conductive lines RL1 included in the first conductive layer CL1 may include a metal material such as copper (Cu), silver (Ag), nickel (Ni), and tungsten (W). The plurality of first conductive lines RL1 may be formed via a photoresist (PR) process after a metal film is stacked, or may be located on the first base layer BL1, or may be formed on the first base layer BL1 via a metal plating process. It is, however, to be understood that the disclosure is not limited thereto.

The first insulating layer DL1 may be located on the first conductive layer CL1. The first insulating layer DL1 may be, but is not limited to, a photoresist formed via a photoresist process. The first insulating layer DL1 may protect the plurality of first conductive lines RL1 included in the first conductive layer CL1 from external lines. The first insulating layer DL1 may include an insulating film made of the same material as the first base layer BL1, for example, polyimide.

Similarly, the second circuit board layer CBL2 may include a second base layer BL2, a second conductive layer CL2 located on the second base layer BL2 and including a plurality of conductive lines RL2, and a second insulating layer DL2 located on the second conductive layer CL2. In addition, the third circuit board layer CBL3 may include a third base layer BL3, a third conductive layer CL3 located on the third base layer BL3 and including a plurality of third conductive lines RL3, and a third insulating layer DL3 located on the third conductive layer CL3. The respective materials of the second circuit board layer CBL2 and the third circuit board layer CBL3 may be identical to the respective materials of the first circuit board layer CBL1. In addition, the second base layer BL2 and the third base layer BL3 may be eliminated.

The fourth circuit portion CB4 will be described in detail with reference to FIGS. 6 and 7.

Figure 6:
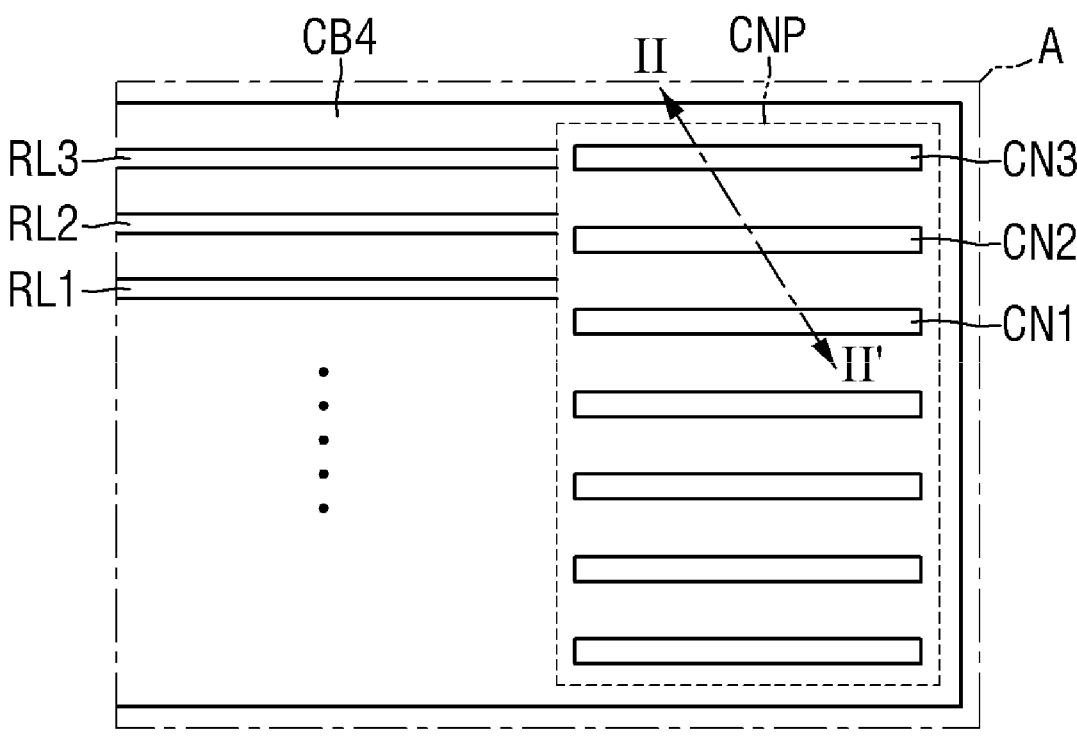
FIG. 6 is an enlarged plan view of area A of FIG. 4.
Figure 7:
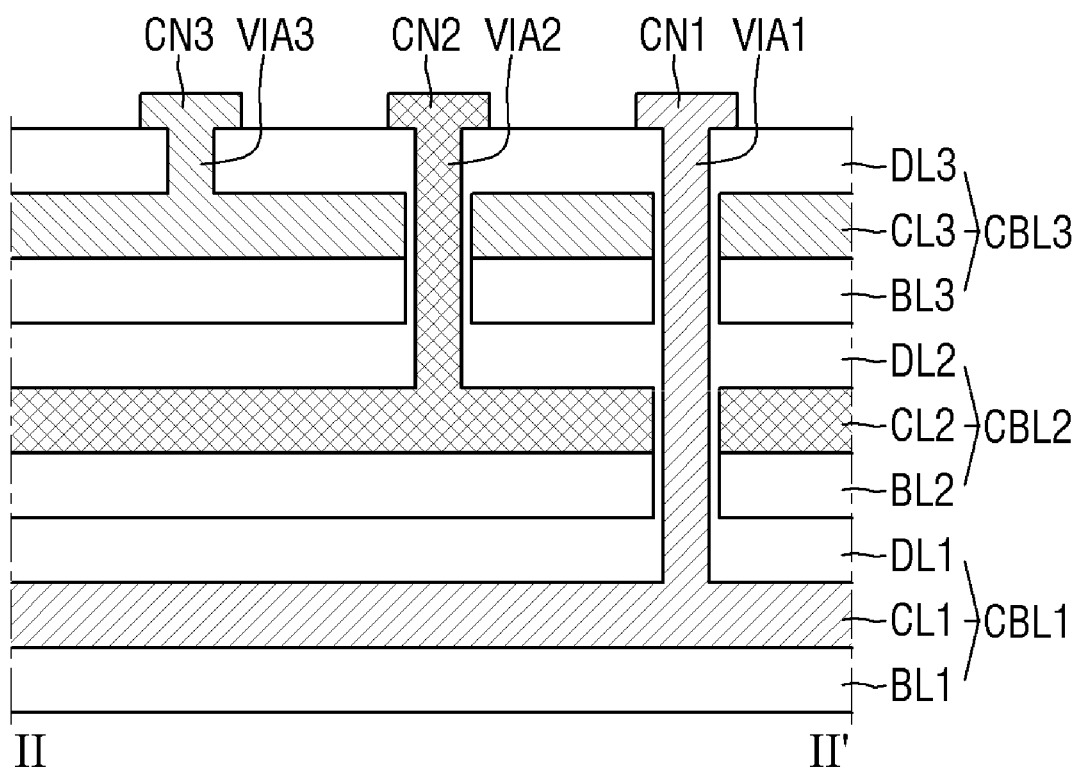
FIG. 7 is a cross-sectional view showing an example of the display panel taken along the line II-II' of FIG. 6.

FIG. 6 is an enlarged plan view of area A of FIG. 4. FIG. 7 is a cross-sectional view showing an example of the display panel taken along the line II-II' of FIG. 6.

The fourth circuit portion CB4 of the circuit board CB may include the connector coupler CNP connected to an external connector. The connector coupler CNP may be a coupling member for electrically connecting the plurality of first to third conductive lines RL1, RL2, and RL3 included in the circuit board CB with pads or lines on another substrate.

The connector coupler CNP may include a plurality of metal patterns CN1, CN2, and CN3. The metal patterns CN1, CN2, and CN3 may be circuit patterns patterned on the first conductive layer CL1, the second conductive layer CL2, and the third conductive layer CL3 via an etching process.

The plurality of metal patterns CN1, CN2, and CN3 may be connected to the first to third conductive lines RL1, RL2, and RL3 through a first via hole VIA1, a second via hole VIA2, and a third via hole VIA3 penetrating through the first circuit board layer CBL1, the second circuit board layer CBL2, and/or the third circuit board layer CBL3, respectively.

The first via hole VIA1 may penetrate through the first insulating layer DL1, the second base layer BL2, the second conductive layer CL2, the second insulating layer DL2, the third base layer BL3, the third conductive layer CL3, and the third insulating layer DL3 to expose the first conductive layer CL1. The exposed first conductive layer CL1 may be connected to the first metal pattern CN1 through the first via hole VIA1.

The second via hole VIA2 may penetrate through the second insulating layer DL2, the third base layer BL3, the third conductive layer CL3, and the third insulating layer DL3 to expose the second conductive layer CL2. The exposed second conductive layer CL2 may be connected to the second metal pattern CN2 through the second via hole VIA2.

The third via hole VIA3 may penetrate through the third insulating layer DL3 to expose the third conductive layer CL3. The exposed third conductive layer CL3 may be connected to the third metal pattern CN3 through the third via hole VIA3.

The first to third metal patterns CN1, CN2, and CN3 may be connected to an external connector, and may apply an electric signal to the first to third conductive lines RL1, RL2, and RL3 included in the first to third conductive layers CL3.

In the display device 1 according to some embodiments, the first to third display panels 11, 12, and 13 are located on the first to third circuit portions CB1, CB2 and CB3 having different thicknesses, respectively, and thus signals may be applied thereto separately. Accordingly, it is possible to drive the display device 1 so that images are displayed as desired.

In addition, in the display device 1 according to the present embodiments, the first to third display panels 11, 12, and 13 are formed on the single circuit board, and a driving signal may be applied to each of them, even without employing separate circuit boards for the display panels 11, 12, and 13. Accordingly, the display device may be reduced, and thus may be carried. In addition, only the single circuit board is used, and thus the cost may be reduced.

The first to third display panels 11, 12, and 13 located on the circuit board CB will be described in detail with reference to FIGS. 8 to 14.

Figure 8:
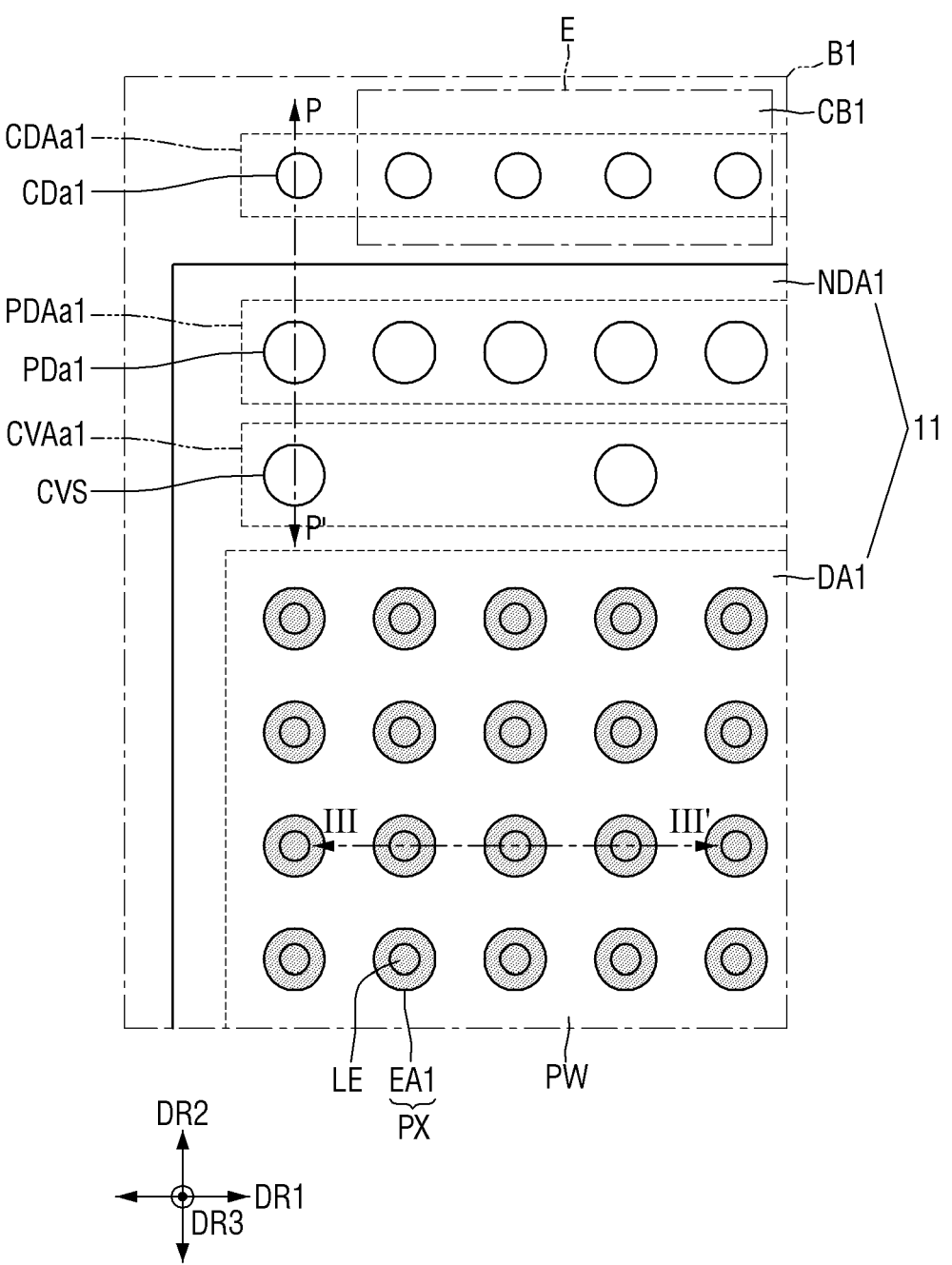
FIG. 8 is an enlarged plan view of area B1 of FIG. 4.
Figure 9:
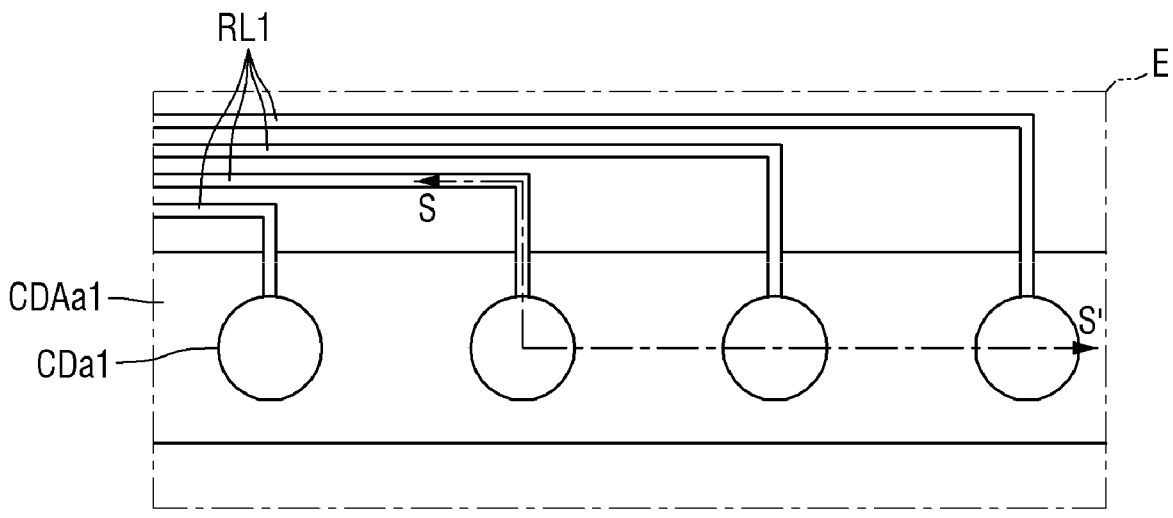
FIG. 9 is an enlarged plan view of area E of FIG. 8.
Figure 10:
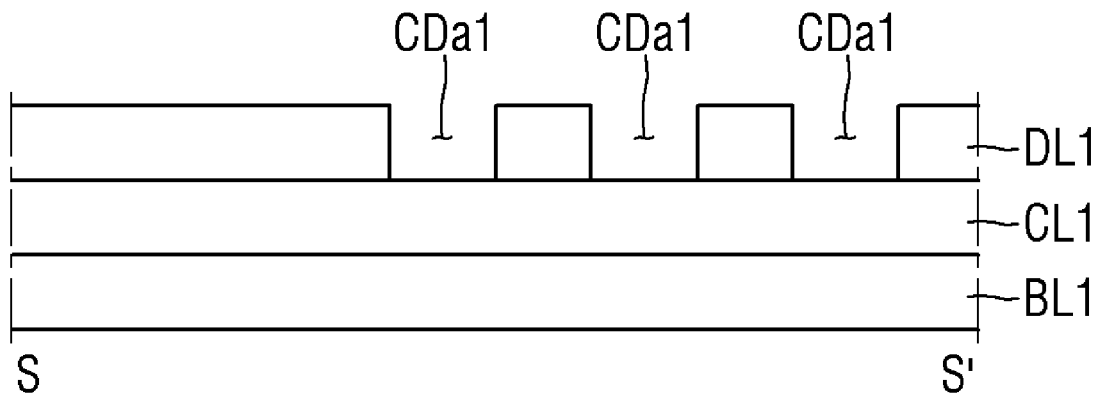
FIG. 10 is a cross-sectional view taken along the line S-S' of FIG. 9.
Figure 11:
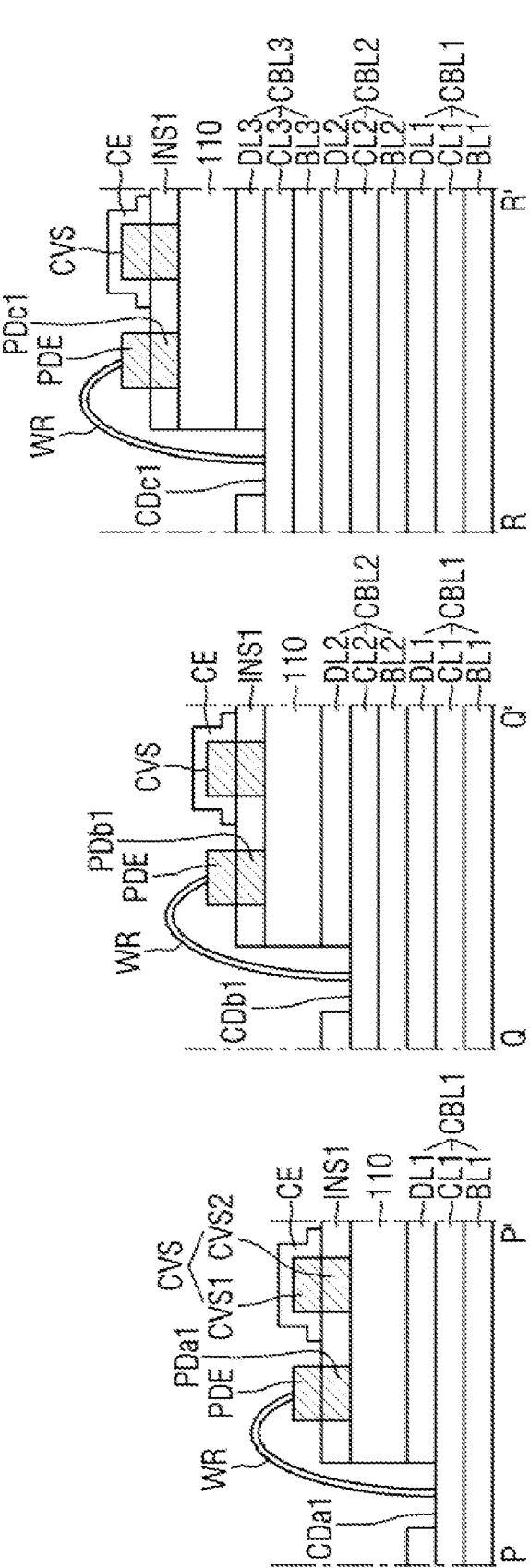
FIG. 11 is a cross-sectional view taken along the lines P-P', Q-Q', and R-R' of FIG. 4.
Figure 12:
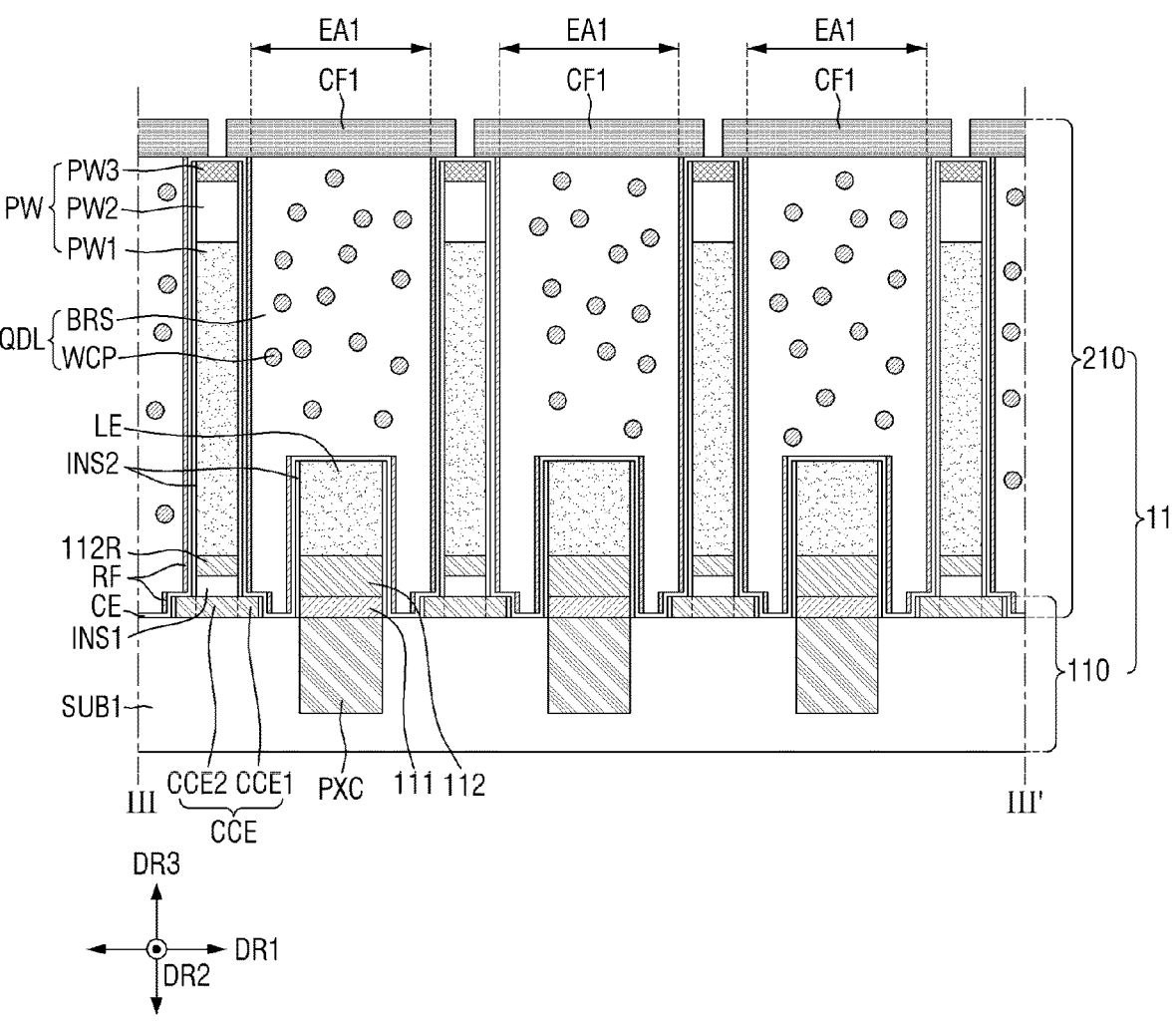
FIG. 12 is a cross-sectional view showing an example of the display panel taken along the line III-III' of FIGS. 4 and 8.
Figure 13:
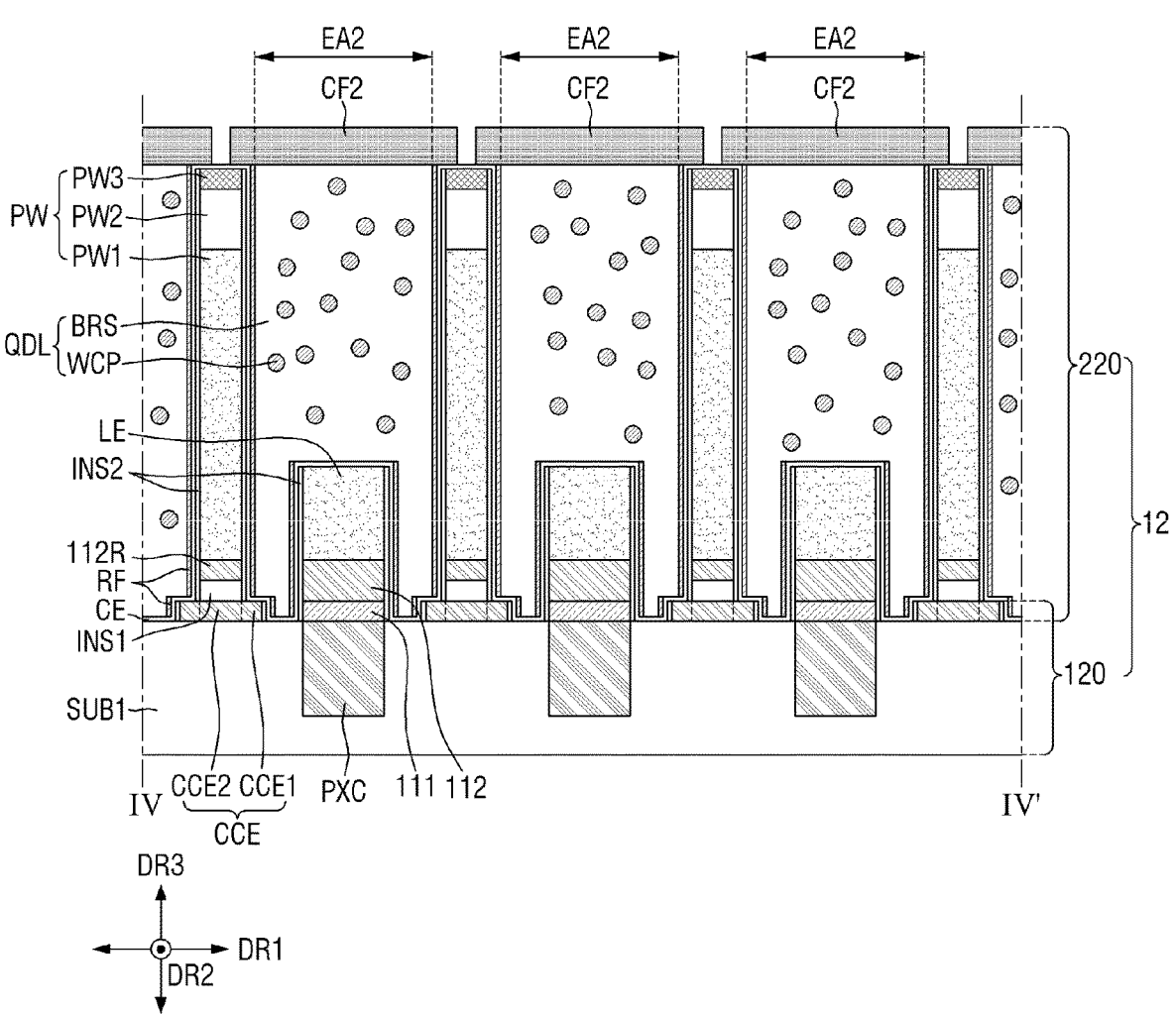
FIG. 13 is a cross-sectional view showing an example of the display panel taken along the line IV-IV' of FIG. 4.
Figure 14:
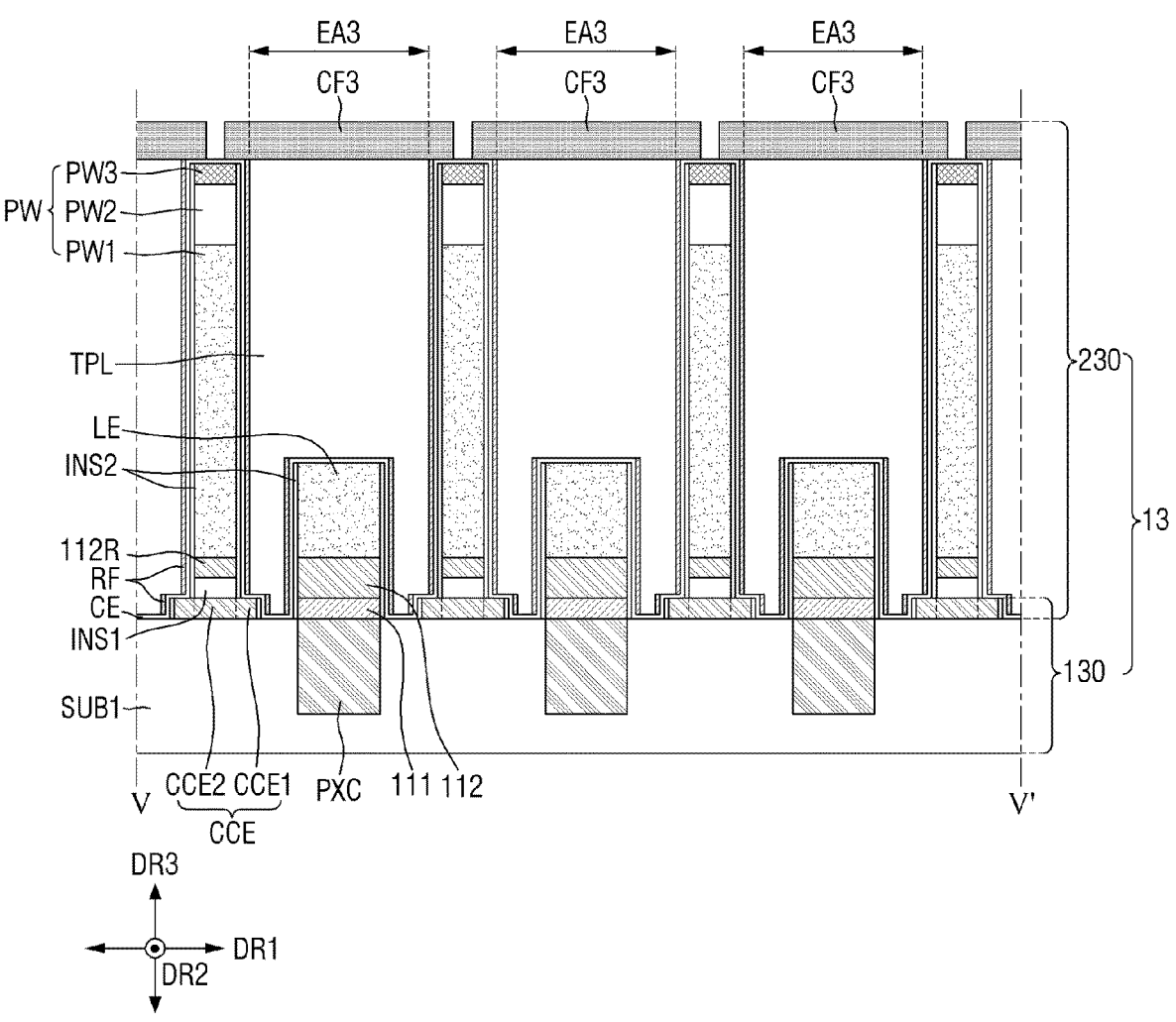
FIG. 14 is a cross-sectional view showing an example of the display panel taken along the line V-V' of FIG. 4.
Figure 15:
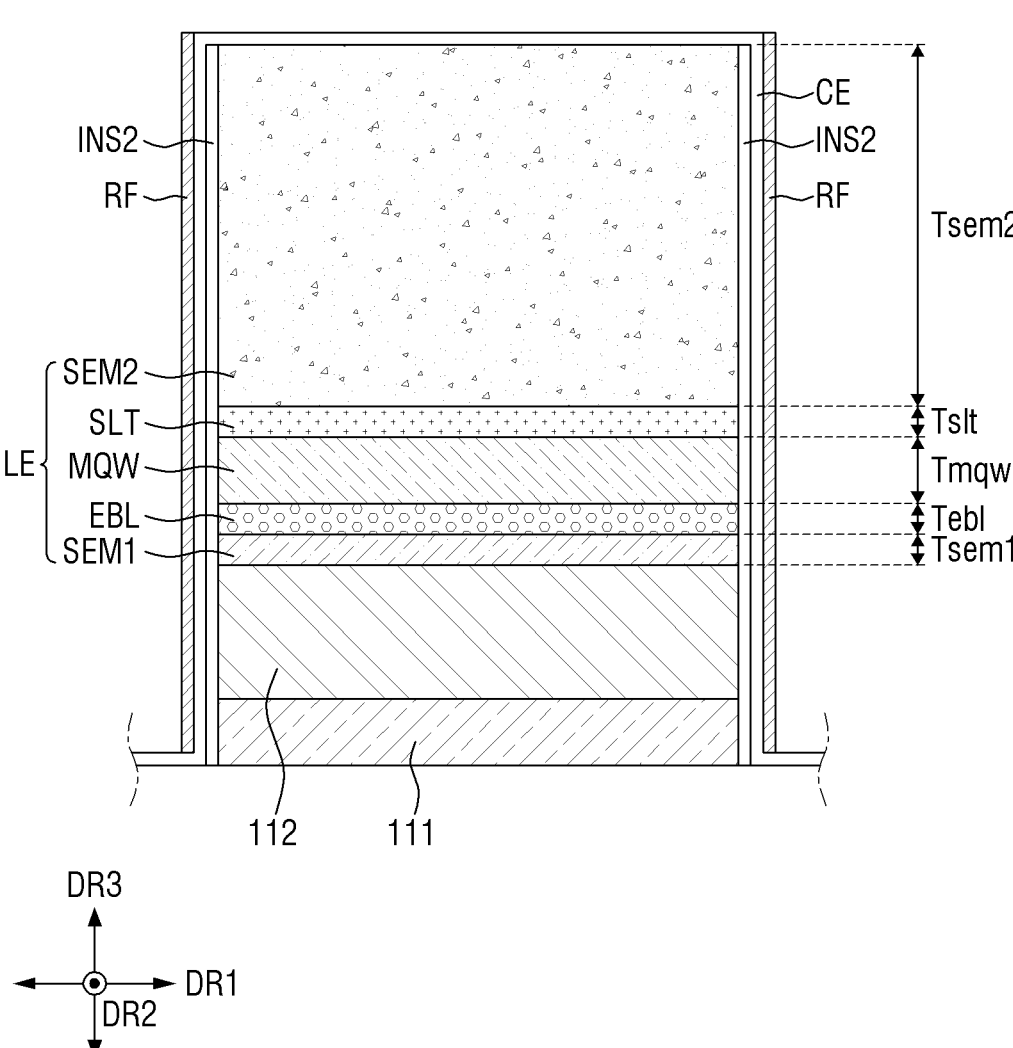
FIG. 15 is an enlarged, cross-sectional view of a light-emitting element according to some embodiments of the disclosure.

FIG. 8 is an enlarged plan view of area B1 of FIG. 4. FIG. 9 is an enlarged plan view of area E of FIG. 8. FIG. 10 is a cross-sectional view taken along the line S-S' of FIG. 9. FIG. 11 is a cross-sectional view taken along the lines P-P', Q-Q' and R-R' of FIG. 4. FIG. 12 is a cross-sectional view showing an example of the display panel taken along the line III-III' of FIGS. 4 and 8. FIG. 13 is a cross-sectional view showing an example of the display panel taken along the line IV-IV' of FIG. 4. FIG. 14 is a cross-sectional view showing an example of the display panel taken along the line V-V' of FIG. 4. FIG. 15 is an enlarged, cross-sectional view of a light-emitting element according to some embodiments of the disclosure.

Referring to FIGS. 4 and 8, the first display area DA1 of the first display panel 11 may include a plurality of pixels PX. Each of the pixels PX may be defined as a minimum light-emitting unit capable of producing one of red, green, and blue light.

Each of the pixels PX included in the first display panel 11 may include a first emission area EA1 that emits light.

The first emission area EA may include a light-emitting element LE that emits light. Although the light-emitting element LE has a circular shape when viewed from the top in the example shown, the present disclosure is not limited thereto. For example, the light-emitting element LE may have a polygonal shape including a quadrangular shape or an oval shape.

Each of the first emission areas EA1 emits the first light. Each of the first emission areas EA1 may convert a part of the third light emitted from the light-emitting element LE into the first light to output it. As described above, the first light may be light in the red wavelength range.

The first emission areas EA1 may be partitioned by a partition wall PW. The partition wall PW may be located to surround the light-emitting elements LE. The partition wall PW may be spaced apart from the light-emitting elements LE. The partition wall PW may have a mesh shape, a net shape, or a lattice shape when viewed from the top.

The first emission area EA1 defined by the partition wall PW may have a circular shape when viewed from the top, but the embodiments of the disclosure are not limited thereto. For example, the first emission area EA1 defined by the partition wall PW may have a polygonal shape including a quadrangular shape or an oval shape when viewed from the top.

The first non-display area NDA1 of the first display panel 11 may include a first common voltage supply area CVAa1, a second common voltage supply area CVAa2, a first pad area PDAa1, and a second pad area PDAa2.

The first common voltage supply area CVAa1 may be located between the first pad area PDAa1 and the first display area DA1. The second common voltage supply area CVAa2 may be located between the second pad area PDAa2 and a display area DA2. Each of the first common voltage supply area CVAa1 and the second common voltage supply area CVAa2 may include a plurality of common voltage supply units CVS connected to the common electrode CE. The common voltage may be supplied to the common electrode CE through the plurality of common voltage supply units CVS.

The plurality of common voltage supply units CVS of the first common voltage supply area CVAa1 may be electrically connected to one of first pads PDa1 of the first pad area PDAa1. That is to say, the plurality of common voltage supply units CVS of the first common voltage supply area CVAa1 may receive the common voltage from one of the first pads PDa1 of the first pad area PDAa1.

The plurality of common voltage supply units CVS of the second common voltage supply area CVAa2 may be electrically connected to one of second pads of the second pad area PDAa2. That is to say, the plurality of common voltage supply units CVS of the second common voltage supply area CVAa2 may receive the common voltage from one of the second pads of the second pad area PDAa2.

The first pad area PDAa1 may be located on the upper side of the first display panel 11. The first pad area PDAa1 may include first pads PDa1 connected to the first circuit portion CB1 of the circuit board CB.

The second pad area PDAa2 may be located on the lower side of the first display panel 11. The second pad area PDAa2 may include second pads connected to the first circuit portion CB1 of the circuit board CB.

The circuit board CB located on the rear surface of the first display panel 11 may include a first circuit pad area CDAa1 and a second circuit pad area CDAa2 in the first circuit portion CB1.

The first circuit pad area CDAa1 may be located on the upper side of the first pad area PDAa1 of the first display panel 11. The first circuit pad area CDAa1 may include first circuit pads CDa1 connected to the first display panel 11. As will be described later, the first pads PDa1 of the first display panel 11 may be electrically connected to the first circuit pads CDa1 of the first circuit portion CB1 through wires WR (see FIG. 11), respectively.

The second circuit pad area CDAa2 may be located on the lower side of the second pad area PDAa2 of the first display panel 11. The second circuit pad area CDAa2 may include second circuit pads connected to the first display panel 11.

According to the present embodiments, the first pad area PDAa1, the second pad area PDAa2, the first circuit pad area CDAa1, and the second circuit pad area CDAa2 are located on that upper or lower side of the first display panel 11, but the disclosure is not limited thereto. For example, the first pad area PDAa1, the second pad area PDAa2, the first circuit pad area CDAa1, and the second circuit pad area CDAa2 may be located on the right or left side of the first display panel 11.

Referring to FIGS. 9 and 10, the first circuit pads CDa1 of the first circuit pad area CDAa1 may be connected to a plurality of first conductive lines RL1 included in the first conductive layer CL1 of the first circuit portion CB1. In some embodiments, the second circuit pads of the second circuit pad area CDAa2 may be connected to the plurality of first conductive lines RL1 included in the first conductive layer CL1 of the first circuit portion CB1.

The first circuit pads CDa1 of the first circuit portion CB1 may be patterns formed where the first insulating layer DL1 located on the first conductive layer CL1 is etched.

Accordingly, the first conductive line RL1, the first circuit pad CDa1, a wire WR, and the first pad PDa1 may be electrically connected with one another. The first display panel 11 may receive an external driving signal through the plurality of first conductive lines RL1.

Referring to FIG. 4, the plurality of pixels PX included in the second display panel 12 and the third display panel 13 are different from the pixels PX of the first display panel 11 including the first emission area EA1, in that the pixels PX respectively include a second emission area EA2 and a third emission area EA3. FIG. 8 shows only an enlarged view of area B1, while omitting an enlarged view of area B2 of the second display panel 12 and an enlarged view of area B3 of the third display panel 13.

Each of the second emission areas EA2 included in the second display panel 12 refers to an area where the second light is emitted. Each of the second emission areas EA2 may convert a part of the third light emitted from the light-emitting element LE into the second light to output the second light. As described above, the second light may be light in the green wavelength range.

Each of the third emission areas EA3 included in the third display panel 13 refers to an area where the third light is emitted. Each of the third emission areas EA3 may output the third light emitted from the light-emitting element LE as it is. As described above, the third light may be light in the blue wavelength range.

Referring to FIGS. 11 to 15, the first display panel 11 may include a semiconductor circuit layer 110 and a light-emitting element layer 210, the second display panel 12 may include a semiconductor circuit layer 120 and a light-emitting element layer 220, and the third display panel 13 may include a semiconductor circuit layer 130 and a light-emitting element layer 230.

The semiconductor circuit layer 110 of the first display panel 11 may be located on (e.g., above) the first circuit board layer CBL1 in the first circuit portion CB1, the semiconductor circuit layer 120 of the second display panel 12 may be located on the first circuit board layer CBL1 and the second circuit board layer CBL2 in the second circuit portion CB2, and the semiconductor circuit layer 130 of the third display panel 13 may be located on the first circuit board layer CBL1, the second circuit board layer CBL2, and the third circuit board layer CBL3 in the third circuit portion CB3.

Each of the semiconductor circuit layers 110, 120, and 130 may include a first substrate SUB1, a plurality of pixel circuits PXC, pixel electrodes 111, first pads PD1, and a first common voltage supply unit CVS1 of a common voltage supply unit CVS.

The first substrate SUB1 may be a silicon wafer substrate. The first substrate SUB1 may be made of monocrystalline silicon.

Each of the plurality of pixel circuits PXC may be located on the first substrate SUB1. Each of the plurality of pixel circuits PXC may include a complementary metal-oxide semiconductor (CMOS) circuit formed using a semiconductor process. Each of the plurality of pixel circuits PXC may include at least one transistor formed via a semiconductor process. In addition, each of the plurality of pixel circuits PXC may further include at least one capacitor formed via a semiconductor process.

The plurality of pixel circuits PXC may be located in the display area DA. The plurality of pixel circuits PXC may be connected to the pixel electrodes 111, respectively. In other words, the plurality of pixel circuits PXC and the plurality of pixel electrodes 111 may be connected in a one-to-one correspondence. Each of the plurality of pixel circuits PXC may apply a pixel voltage or an anode voltage to the pixel electrode 111.

The pixel electrodes 111 may be located on the pixel circuits PXC, respectively. Each of the pixel electrodes 111 may be an exposed electrode exposed from the respective pixel circuit PXC. In other words, each of the pixel electrodes 111 may protrude from the upper surface of the respective pixel circuit PXC. The pixel electrodes 111 may be formed integrally with the pixel circuits PXC, respectively. Each of the pixel electrodes 111 may receive a pixel voltage or an anode voltage from the respective pixel circuit PXC. The pixel electrodes 111 may include aluminum (Al).

Each of the first pads PDa1, PDb1, and PDc1 and the first common voltage supply units CVS1 may be an exposed electrode that is exposed from the first substrate SUB1. Each of the first pads PDa1, PDb1, and PDc1 and the first common voltage supply unit CVS1 may include the same material as the pixel electrodes 111. For example, each of the first pads PDa1, PDb1, and PDc1 and the first common voltage supply unit CVS1 may include aluminum (Al).

The second pads of the second pad areas PDAa2, PDAb2, and PDAc2 are substantially identical to the first pads PDa1, PDb1, and PDc1. Accordingly, redundant descriptions will be omitted.

Each of the light-emitting element layers 210, 220, and 230 may include the first emission area EA1, the second emission area EA2, and the third emission area EA3 to emit light. The light-emitting element layers 210, 220, and 230 may include connection electrodes 112, a pad connection electrode PDE, a second common voltage supply unit CVS2 of the common voltage supply unit CVS, a common connection electrode CCE, light-emitting elements LE, a first insulating film INS1, a conductive pattern 112R, a partition wall PW, a second insulating film INS2, a common electrode CE, a reflective film RF, and a plurality of color filters CF1, CF2 and CF3. It should be noted that the light-emitting element layer 210 of the first display panel 11 and the light-emitting element layer 220 of the second display panel 12 may include a wavelength conversion layer QDL, while the light-emitting element layer 230 of the third display panel 13 may include a transparent layer TPL instead of the wavelength conversion layer QDL.

The connection electrodes 112 may be located on the pixel electrodes 111, respectively. That is to say, the connection electrodes 112 may be connected to the pixel electrodes 111, respectively. The connection electrodes 112 may work as bonding metals for bonding the pixel electrodes 111 to the light-emitting elements LE during a fabricating process. For example, the connection electrodes 112 may include at least one of gold (Au), copper (Cu), aluminum (Al), and tin (Sn). Alternatively, the connection electrodes 112 may include a first layer including one of gold (Au), copper (Cu), aluminum (Al), and tin (Sn), a second layer including another one of gold (Au), copper (Cu), aluminum (Al), and tin (Sn). In this instance, the second layer may be located on the first layer.

The common connection electrode CCE may be spaced apart from the pixel electrode 111 and the connection electrode 112. The common connection electrode CCE may be located to surround the pixel electrode 111 and the connection electrode 112.

The common connection electrode CCE may include a first common connection electrode CCE1 located in the first to third emission areas EA1, EA2, and EA3, and a second common connection electrode CCE2 overlapping the partition wall PW in the third direction DR3.

The common connection electrode CCE may be connected to one of the first pads PDa1, PDb1, and PDc1 of the first pad areas PDAa1, PDAb1, and PDAc1 of the first to third non-display areas NDA1, NDA2, and NDA3, or one of the second pads of the second pad areas PDAa2, PDAb2, and PDAc2 to receive a common voltage. The common connection electrode CCE may include the same material as the connection electrodes 112. For example, the common connection electrode CCE may include at least one of gold (Au), copper (Cu), aluminum (Al), and tin (Sn). When each of the connection electrodes 112 includes the first layer and the second layer, the common connection electrode CCE may include the same material as the first layer of each of the connection electrodes 112.

The pad connection electrodes PDE may be respectively located on the first pads PDa1, PDb1, and PDc1, and the second common voltage supply unit CVS2 may be located on the first common voltage supply unit CVS1. The pad connection electrode PDE may be in contact with the first pads PDa1, PDb1, and PDc1, and the second common voltage supply unit CVS2 may be in contact with the first common voltage supply unit CVS1. The pad connection electrode PDE and the second common voltage supply unit CVS2 may include the same material as the connection electrodes 112. For example, each of the pad connection electrode PDE and the second common voltage supply unit CVS2 may include at least one of gold (Au), copper (Cu), aluminum (Al), and tin (Sn). When each of the connection electrodes 112 includes a first layer and a second layer, each of the pad connection electrode PDE and the second common voltage supply unit CVS2 may include a first layer and a second layer.

The pad connection electrode PDE may be connected to a circuit pad of the circuit pad area of the circuit board CB through a conductive connection member, such as a wire WR. That is to say, the first pads PDa1, PDb1, and PDc1, the pad connection electrode PDE, the wire WR, and the first circuit pads CDa1, CDb1, and CDc1 of the circuit board CB may be electrically connected with one another.

Accordingly, the driving signal for driving the first display panel 11 is applied through the plurality of first conductive lines RL1, and may move to the first circuit pad CDa1, the wire WR, the pad connection electrode PDE, and the first pad PDa1. In addition, the driving signal for driving the second display panel 12 is applied through the plurality of second conductive lines RL2, and may move to the first circuit pad CDb1, the wire WR, the pad connection electrode PDE, and the first pad PDb1. In addition, the driving signal for driving the third display panel 13 is applied through the plurality of third conductive lines RL3, and may move to the first circuit pad CDc1, the wire WR, the pad connection electrode PDE, and the first pad PDc1.

The first display panel 11, the second display panel 12, and the third display panel 13 may be driven individually.

The light-emitting element layers 210, 220, and 230 may include first to third emission areas EA1, EA2, and EA3 partitioned by the partition wall PW, respectively. One of the light-emitting elements LE, the wavelength conversion layer QDL, and a plurality of color filters CF1 and CF2 may be located in each of the first and second emission areas EA1 and EA2. The light-emitting element LE, the transparent layer TPL, and the third color filter CF3 may be located in each of the third emission areas EA3.

The light-emitting elements LE may be located on the connection electrodes 112. The light-emitting element LE may be a vertical light-emitting diode extended in the third direction DR3. That is to say, the length of the light-emitting element LE in the third direction DR3 may be larger than the length in the horizontal direction (e.g., the first or second direction DR1 or DR2). For example, the length of the light-emitting element LE in the third direction DR3 may be about 1 μm to about 5 μm.

The light-emitting elements LE may be micro light-emitting diodes or nano light-emitting diodes.

The light-emitting element LE may include a first semiconductor layer SEM1, an electron blocking layer EBL, an active layer MQW, a superlattice layer SLT, and a second semiconductor layer SEM2 in the third direction DR3, as shown in FIG. 15. The first semiconductor layer SEM1, the electron blocking layer EBL, the active layer MQW, the superlattice layer SLT and the second semiconductor layer SEM2 may be stacked on one another in this order in the third direction DR3.

The first semiconductor layer SEM1 may be located on the connection electrode 112. The first semiconductor layer SEM1 may be doped with a dopant of a first conductivity type, such as Mg, Zn, Ca, Se, and Ba. For example, the first semiconductor layer SEM1 may be p-GaN doped with p-type Mg. The thickness Tsem1 of the first semiconductor layer SEM1 may range from about 30 nm to about 200 nm.

The electron blocking layer EBL may be located on the first semiconductor layer SEM1. The electron blocking layer EBL may suppress, reduce, or prevent too many electrons from flowing into the active layer MQW. For example, the electron blocking layer EBL may be p-AlGaN doped with p-type Mg. The thickness Tebl of the electron blocking layer EBL may be about 10 nm to about 50 nm. The electron blocking layer EBL may be eliminated in other embodiments.

The active layer MQW may be located on the electron blocking layer EBL. The active layer MQW may emit light as electron-hole pairs are combined therein in response to an electrical signal applied through the first semiconductor layer SEM1 and the second semiconductor layer SEM2. The active layer MQW may emit third light having a central wavelength range of about 450 nm to about 495 nm (e.g., light of the blue wavelength range).

The active layer MQW may include a material having a single or multiple quantum well structure. When the active layer MQW includes a material having the multiple quantum well structure, well layers and barrier layers may be alternately stacked on one another in the structure. The well layers may be made of InGaN, and the barrier layers may be made of GaN or AlGaN, but the disclosure is not limited thereto. The thickness of the well layers may be about 1 nm to about 4 nm, and the thickness of the barrier layers may be 3 to 10 nm.

Alternatively, the active layer MQW may have a structure in which a semiconductor material having a large band gap energy and a semiconductor material having a small band gap energy are alternately stacked on one another, and may include other Group III to Group V semiconductor materials depending on the wavelength range of the emitted light. The light emitted by the active layer is not limited to the third light (light in the blue wavelength range). In some implementations, the second light (light in the green wavelength range) or the first light (light in the red wavelength range) may be emitted by emitted by the active layer.

The superlattice layer SLT may be located on the active layer MQW. The superlattice layer SLT may relieve stress between the second semiconductor layer SEM2 and the active layer MQW. For example, the superlattice layer SLT may be made of InGaN or GaN. The thickness Tslt of the superlattice layer SLT may range from about 50 nm to about 200 nm. The superlattice layer SLT may be eliminated in other embodiments.

The second semiconductor layer SEM2 may be located on the superlattice layer SLT. The second semiconductor layer SEM2 may be doped with a dopant of a second conductivity type such as Si, Ge and Sn. For example, the second semiconductor layer SEM2 may be n-GaN doped with n-type Si. The thickness Tsem2 of the second semiconductor layer SEM2 may range from about 2 μm to about 1 μm.

The first insulating film INS1 may be located on the common connection electrode CCE. The first insulating film INS1 may be implemented as an inorganic film such as a silicon oxide film ($SiO_2$), an aluminum oxide film ($Al_2O_3$), and a hafnium oxide film (HfOx).

The conductive pattern 112R may be located on the first insulating film INS1. The conductive pattern 112R may be located between the first insulating film INS1 and the partition wall PW in the third direction DR3.

The conductive pattern 112R may be residues formed via the same process with the connection electrodes 112 and the common connection electrode CCE. Therefore, the conductive pattern 112R may include the same material as the connection electrodes 112 and the common connection electrode CCE. For example, the conductive pattern 112R may include at least one of gold (Au), copper (Cu), aluminum (Al), and tin (Sn). When each of the connection electrodes 112 includes the first layer and the second layer, the conductive pattern 112R may include the same material as the second layer of each of the connection electrodes 112.

The partition wall PW may be located on the conductive pattern 112R. The partition wall PW may be spaced apart from each of the light-emitting elements LE. The partition wall PW may be located to surround each of the light-emitting elements LE, and may partition the emission areas EA1, EA2, and EA3.

As shown in FIGS. 12 to 14, the partition wall PW may include, but is not limited to, a first partition wall PW1, a second partition wall PW2, and a third partition wall PW3. At least a part of the first partition wall PW1 may include the same material as the light-emitting element LE. The second partition wall PW2 may be located on the first partition wall PW1, and may be formed as an inorganic film such as a silicon oxide film ($SiO_2$), an aluminum oxide film ($Al_2O_3$), and a hafnium oxide film (HfOx). The third partition wall PW3 may be located on the second partition wall PW2. The third partition wall PW3 may include a conductive material such as nickel (Ni).

The second insulating film INS2 may be located on side surfaces of (e.g., may surround) the common connection electrode CCE, side surfaces of the partition wall PW, side surfaces of each of the pixel electrodes 111, side surfaces of each of the connection electrodes 112, and side surfaces of each of light-emitting elements LE. The second insulating film INS2 may be implemented as an inorganic film such as a silicon oxide film ($SiO_2$), an aluminum oxide film ($Al_2O_3$), and a hafnium oxide film (HfOx). The thickness of the second insulating film INS2 may be about 0.1 μm.

The common electrode CE may be located on the upper and side surfaces of each of the light-emitting elements LE, and the upper and side surfaces of the partition wall PW (e.g., may contact upper surfaces of, and may surround the side surfaces of, the light-emitting elements LE and the partition wall PW in a plan view, such as with the second insulating film INS2 therebetween). That is to say, the common electrode CE may be located to cover the upper and side surfaces of each of the light-emitting elements LE, and the upper and side surfaces of the partition wall PW.

The common electrode CE may be in contact with the second insulating film INS2 located on the side surfaces of the first common connection electrode CCE1, the side surfaces of the partition wall PW, the side surfaces of each of the pixel electrodes 111, the side surfaces of each of the connection electrodes 112, and the side surfaces of each of light-emitting elements LE. In addition, the common electrode CE may be in contact with the upper surface of the first common connection electrode CCE1, the upper surface of each of the light-emitting elements LE, and the upper surface of the partition wall PW.

The common electrode CE may be in contact with portions of the upper surface of the first common connection electrode CCE1 and the upper surface of the light-emitting element LE that are not covered by the second insulating film INS2, but are instead exposed at the edge of each of the first to third emission areas EA1, EA2, and EA3. Accordingly, the common voltage supplied to the common connection electrode CCE may be applied to the light-emitting element LE. A first end of the light-emitting element LE may receive the pixel voltage or the anode voltage of the pixel electrode 111 through the connection electrode 112, and a second end thereof may receive the common voltage through the common electrode CE. The light-emitting element LE may emit light with a luminance (e.g., a predetermined luminance) according to a voltage difference between the pixel voltage and the common voltage.

The common electrode CE may include a transparent conductive material. The common electrode CE may be made of a transparent conductive oxide (TCO) such as indium tin oxide (ITO) and indium zinc oxide (IZO). The thickness of the common electrode CE may be about 0.1 μm.

The reflective film RF serves to reflect some of the lights emitted from the light-emitting element LE that travel in other directions than the vertical direction. The reflective film RF may include a metal material having high reflectivity, such as aluminum (Al). The thickness of the reflective film RF may be about 0.1 μm. The reflective film RF may be in contact with the common electrode CE.

Referring to FIGS. 12 and 13, the wavelength conversion layer QDL may be located on the light-emitting element LE in each of the first emission area EA1 and the second emission area EA2. The wavelength conversion layer QDL may be located to cover the light-emitting element LE in each of the first emission area EA1 and the second emission area EA2.

The wavelength conversion layer QDL may include a base resin BRS and wavelength conversion particles WCP. The base resin BRS may include a transparent organic material. For example, the base resin BRS may include an epoxy resin, an acrylic resin, a cardo resin, or an imide resin.

The wavelength conversion particles WCP may convert the first light incident from the light-emitting element LE into third light, or may convert the second light incident from the light-emitting element LE into third light. For example, the wavelength conversion particles WCP may convert light in the red wavelength range into light in the blue wavelength range. As still another example, the wavelength conversion particles WCP may convert light in the green wavelength range into light in the blue wavelength range. The wavelength conversion particles and may be quantum dots (QD), quantum rods, fluorescent material, or phosphorescent material. The quantum dots may include IV nanocrystals, II-VI compound nanocrystals, III-V compound nanocrystals, IV-VI nanocrystals, or combinations thereof.

A quantum dot may include a core and a shell overcoating the core. The core may be, but not limited to, at least one of CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, Fe2O3, Fe3O4, Si, and Ge. The shell may include, but not limited to, at least one of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TIN, TIP, TIAs, TISb, PbS, PbSe, and PbTe.

The wavelength conversion layer QDL may further include scatterers for scattering the light of the light-emitting element LE in random directions. The scattering particles may include metal oxide particles or organic particles. For example, the metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). In addition, the organic particles may include an acrylic resin or a urethane-based resin. The diameter of the scatterers may be several to several tens of nanometers.

The first and second color filters CF1 and CF2 may be located on the wavelength conversion layer QDL in the first and second emission areas EA1 and EA2. In addition, the first and second color filters CF1 and CF2 may be located on the partition wall PW. The first and second color filters CF1 and CF2 may transmit one of the first and second lights, and may absorb or block the third light.

Referring to FIG. 14, the transparent layer TPL may be located on the light-emitting element LE in the third emission area EA3. The transparent layer TPL may be located to cover the light-emitting element LE in the third emission area EA3.

The transparent layer TPL may include a light-transmitting organic material. For example, the base resin BRS may include an epoxy resin, an acrylic resin, a cardo resin, or an imide resin. The transparent layer TPL may not absorb the third light incident from the light-emitting element LE, but may transmit it as it is. For example, the transparent layer TPL may transmit light in the blue wavelength range without absorbing it.

The third color filter CF3 may be located on the transparent layer TPL in the third emission area EA3. In addition, the third color filter CF3 may be located on the partition wall PW. The third color filter CF3 may transmit the third light, and may absorb or block the first light and the second light.

In other embodiments, a black matrix may be located between the first to third color filters CF1, CF2 and CF3. The black matrix may include an inorganic black pigment such as carbon black or an organic black pigment.

According to some embodiments, the first to third display panels 11, 12, and 13 emitting mono-color light are located on the single circuit board CB having different thicknesses, so that the display device 1 may become compact and the cost may be reduced.

In addition, the circuit board CB having the bendable first to third connection portions BD1, BD2, and BD3 is located on the rear surfaces of the first to third display panels 11, 12, and 13 each emitting respective mono-color light, so that light may be normally incident on (e.g., substantially normal to) the three side surfaces of the optical combiner 20. Accordingly, the display device 1 may display images of multi-color light using the display panels of mono-color light.

Figure 16:
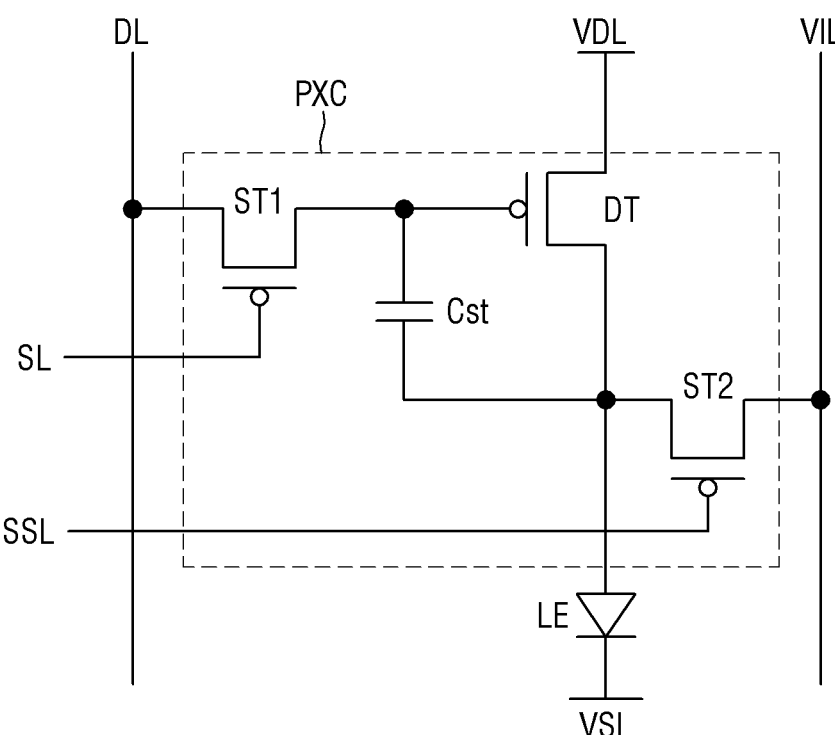
FIG. 16 is a circuit diagram of a pixel of a display device according to some embodiments of the disclosure.

FIG. 16 is a circuit diagram of a pixel of a display device according to some embodiments of the disclosure.

Referring to FIG. 16, each of the plurality of pixels PX may include a light-emitting element LE, and a pixel circuit PXC controlling the amount of light emitted from the light-emitting element LE. The amount of the light emitted from the light-emitting element LE may be proportional to a driving current. The light-emitting element LE may be an inorganic light-emitting element including an anode electrode, a cathode electrode, and an inorganic semiconductor located between the anode electrode and the cathode electrode. For example, the light-emitting element LE may be a micro light-emitting diode.

The anode electrode of the light-emitting element LE may be connected to the source electrode of the driving transistor DT, and the cathode electrode may be connected to a second supply voltage line VSL from which a low-level voltage, which is lower than the high-level voltage, is applied. In the circuit diagram of FIG. 4, the anode electrode of the light-emitting element LE is the pixel electrode 111 (see FIG. 12), and the cathode electrode thereof is the common electrode CE (see FIG. 12).

The driving transistor DT adjusts an electric current flowing from the first supply voltage line VDL, from which the first supply voltage is applied to the light-emitting element LE, according to the voltage difference between the gate electrode and the source electrode of the driving transistor DT. The gate electrode of the driving transistor DT may be connected to a first electrode of a first transistor ST1, the source electrode thereof may be connected to the anode electrode of the light-emitting element LE, and the drain electrode thereof may be connected to the first supply voltage line VDL to which a high-level voltage is applied.

The first transistor ST1 is turned on by a scan signal of a scan signal line SL to connect a data line DL with the gate electrode of the driving transistor DT. The gate electrode of the first transistor ST1 may be connected to the scan line SL, a first electrode thereof may be connected to the gate electrode of the driving transistor DT, and a second electrode thereof may be connected to the data line DTL.

The second transistor ST2 may be turned on by a sensing signal of a sensing signal line SSL to connect an initialization voltage line VIL to the source electrode of the driving transistor DT. The gate electrode of the second transistor ST2 may be connected to the sensing signal line SSL, a first electrode thereof may be connected to the initialization voltage line VIL, and a second electrode thereof may be connected to the source electrode of the driving transistor DT.

The first electrode of each of the first and second transistors ST1 and ST2 may be a source electrode, and the second electrode thereof may be a drain electrode, but the disclosure is not limited thereto. That is to say, the first electrode of each of the first and second transistors ST1 and ST2 may be a drain electrode, and the second electrode thereof may be a source electrode.

The capacitor Cst may be formed between the gate electrode and the source electrode of the driving transistor DT. The capacitor Cst stores the voltage equal to the difference between the gate voltage and the source voltage of the driving transistor DT.

It should be understood, however, that the disclosure is not limited thereto. The pixel circuit PXC may have a structure that further includes a plurality of transistors.

In addition, although the driving transistor DT and the first and second transistors ST1 and ST2 are NMOS transistors in the example shown in FIG. 4, some or all of the transistors may be implemented as PMOS transistors.

Figure 17:
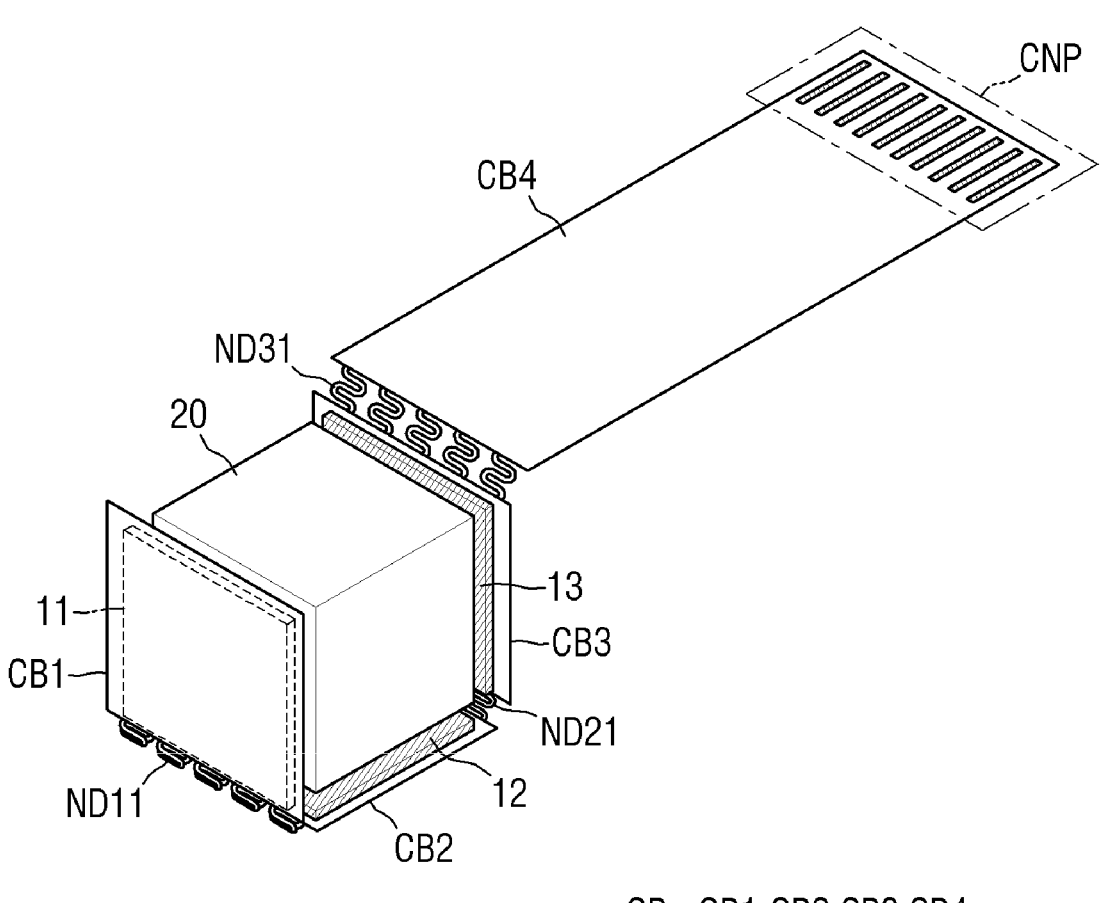
FIG. 17 is a side view of a display device according to other embodiments of the disclosure.
Figure 17:
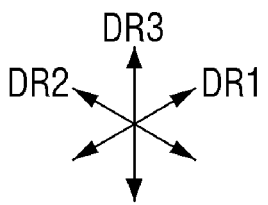
Figure 18:
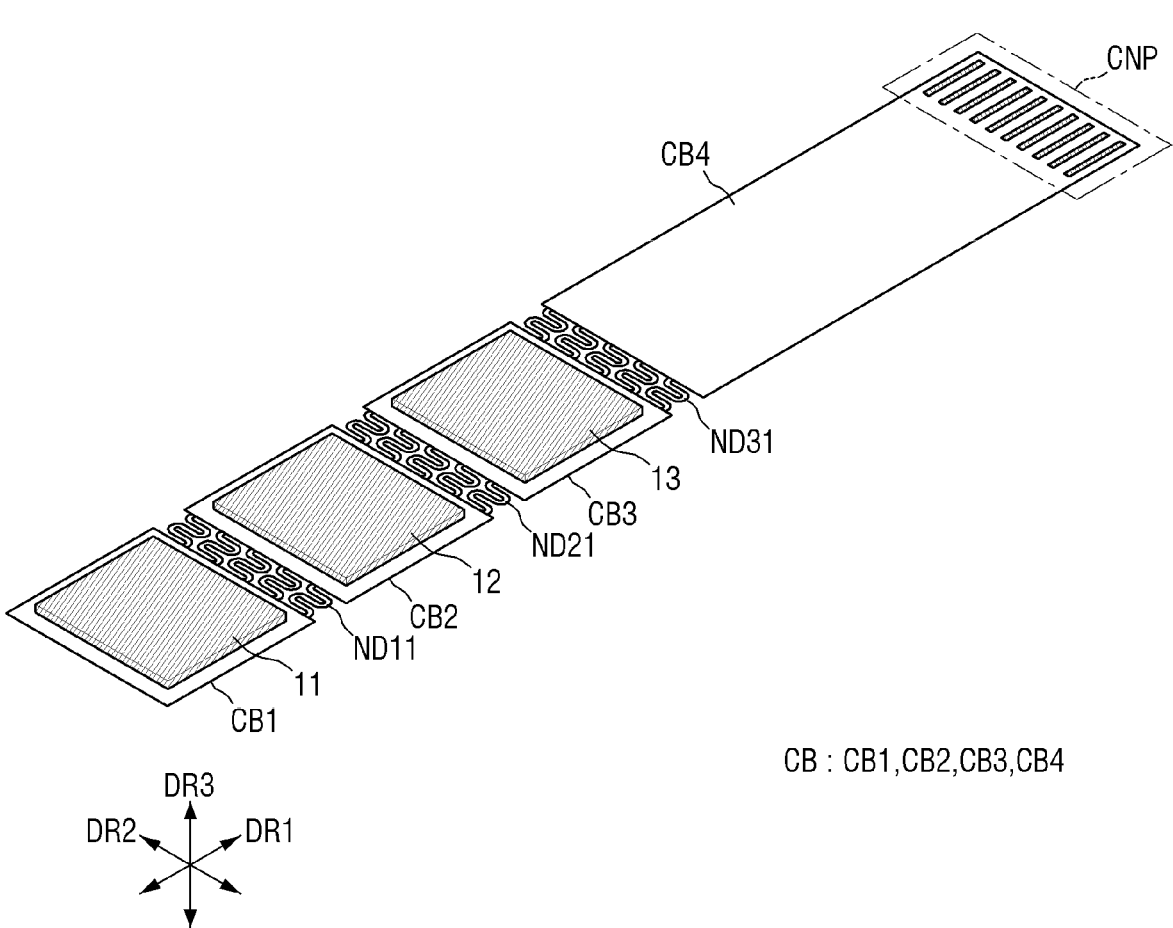
FIG. 18 is a perspective view showing a side of a display device according to other embodiments of the disclosure.
Figure 19:
FIG. 19 is a plan view of a display device according to other embodiments of the disclosure.
Figure 20:
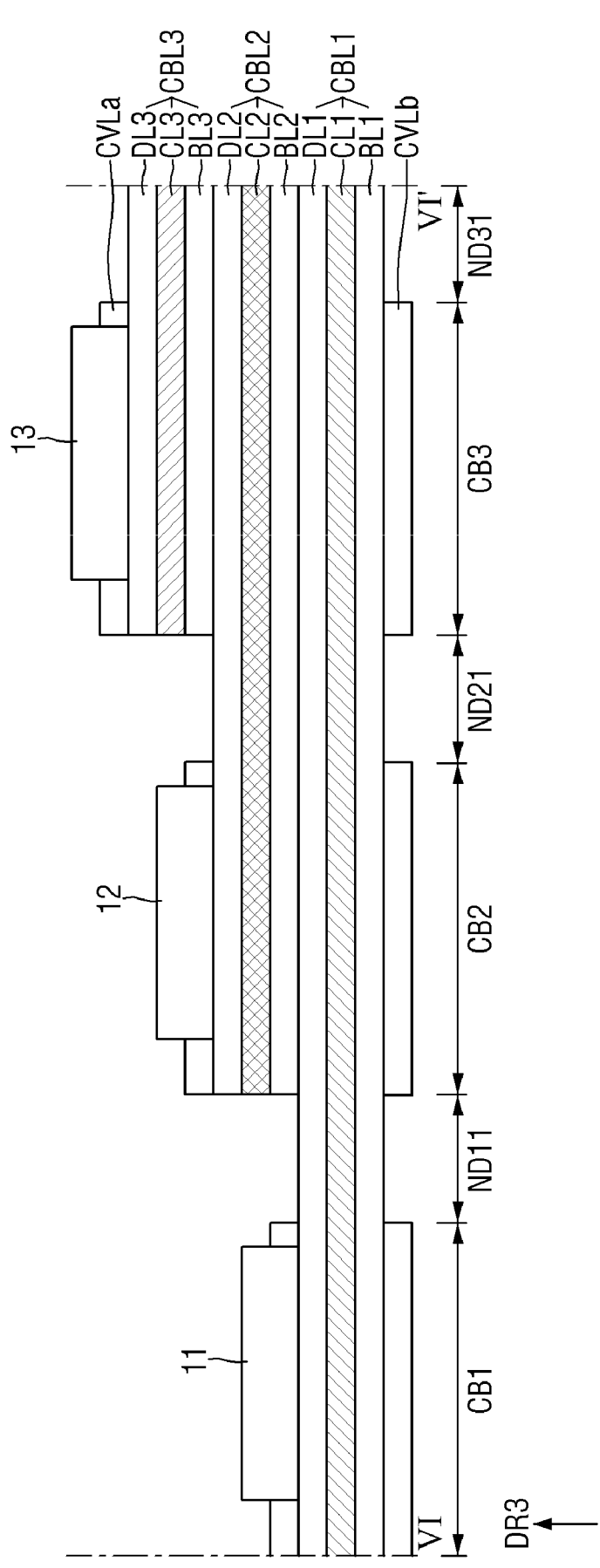
FIG. 20 is a cross-sectional view showing an example of the display panel taken along the line VI-VI' of FIG. 19.
Figure 21:
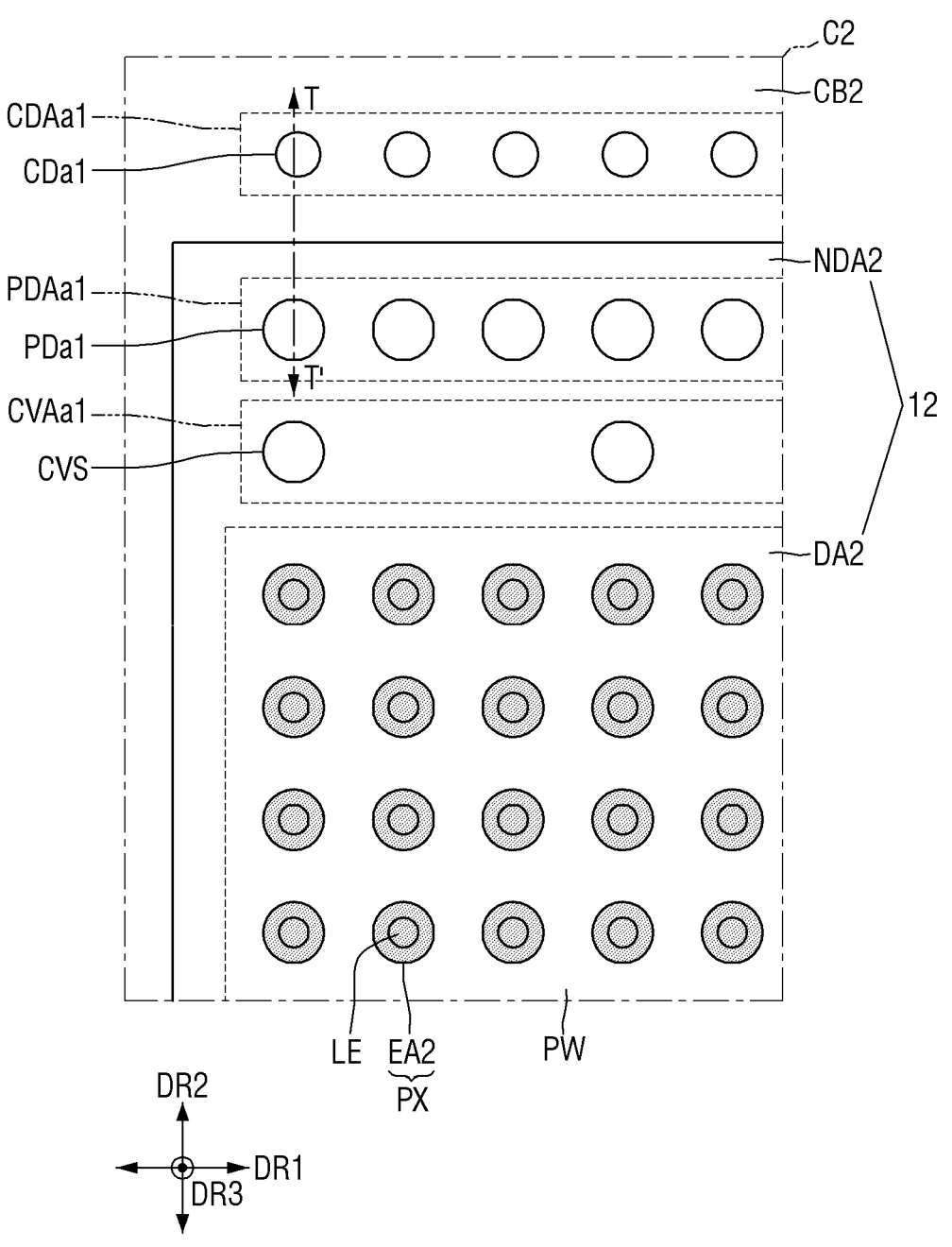
FIG. 21 is an enlarged plan view of area C2 of FIG. 19.
Figure 22:
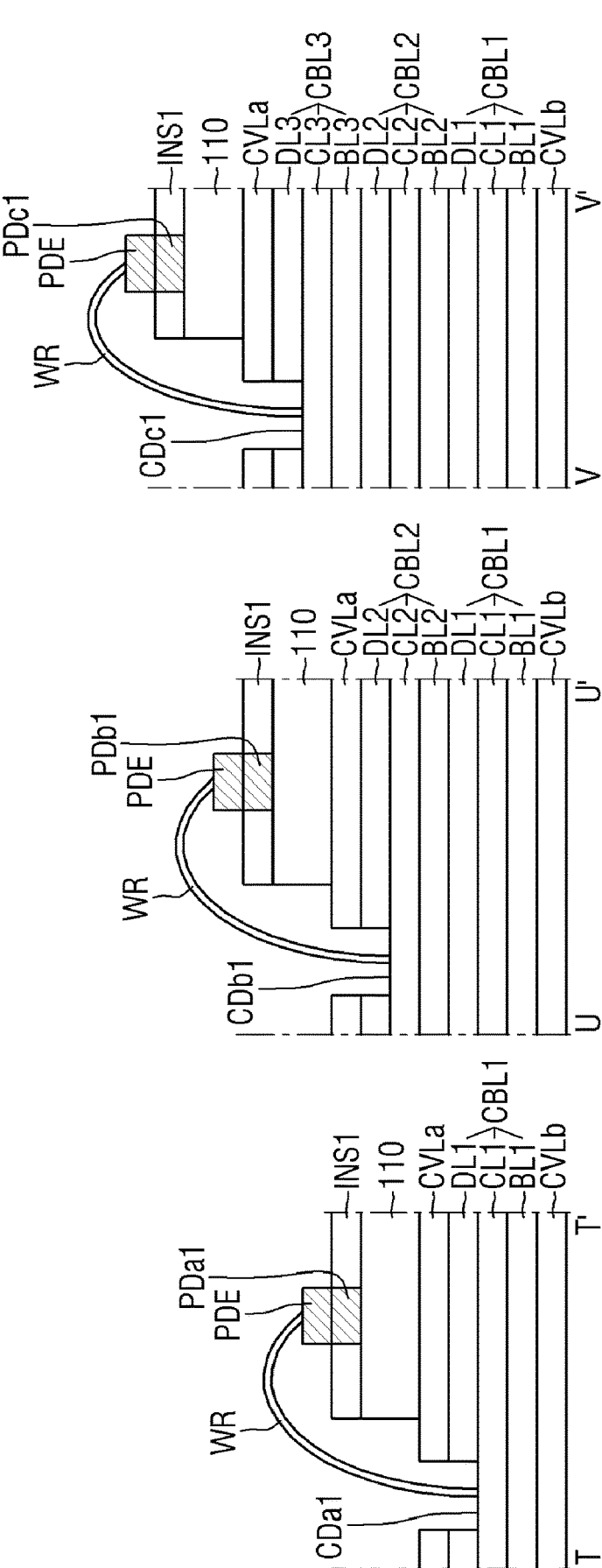
FIG. 22 is a cross-sectional view taken along the lines T-T', U-U', and V-V' of FIG. 19.

Hereinafter, a display device 1 according to other embodiments will be described with reference to FIGS. 17 to 22. FIG. 17 is a side view of a display device according to other embodiments of the disclosure. FIG. 18 is a plan view showing a side of a display device according to other embodiments of the disclosure. FIG. 19 is a plan view of a display device according to other embodiments of the disclosure. FIG. 20 is a cross-sectional view showing an example of the display panel taken along the line VI-VI' of FIG. 19. FIG. 21 is an enlarged plan view of area C2 of FIG. 19. FIG. 22 is a cross-sectional view taken along the lines T-T', U-U', and V-V' of FIG. 19.

First to third display panels 11, 12, and 13 are located on a single circuit board CB in a display device 1 according to the present embodiments as in the above-described embodiments, with a difference in that first to third connection portions ND11, ND21, and ND31, which respectively connect between first to fourth circuit portions CB1, CB2, CB3, and CB4, form cutout patterns.

The first to third connection portions ND11, ND21, and ND31 may include cutout patterns. Each of the cutout patterns may be of a serpentine type as shown in FIG. 19. In this instance, each of the cutout patterns may include first bent portions BP1 having a first curvature and second bent portions BP2 having a second curvature. Each of the cutout patterns may have a shape in which a pair of the first bent portion BP1 and the second bent portion BP2 is repeatedly arranged. The first curvature of the first bent portion BP1 and the second curvature of the second bent portion BP2 may be equal to each other or different from each other.

The first connection portion ND11 may be located between the first circuit portion CB1 and the second circuit portion CB2 to connect the first circuit portion CB1 with the second circuit portion CB2, the second connection portion ND21 may be located between the second circuit portion CB2 and the third circuit portion CB3 to connect the second circuit portion CB2 with the third circuit portion CB3, and the third connection portion ND31 may be located between the third circuit portion CB3 and the fourth circuit portion CB4 to connect the third circuit portion CB3 with the fourth circuit portion CB4.

The first circuit CB1, the second circuit CB2, the third circuit CB3, and the fourth circuit CB4 may form the single circuit board CB by the first to third connection portions ND11, ND21, and ND31. The first circuit portion CB1, the second circuit portion CB2, the third circuit portion CB3, and the fourth circuit portion CB4 may be arranged sequentially in the first direction DR1.

The first to third connection portions ND11, ND21, and ND31 may be bending portions that are suitably able to be bent or folded when viewed from the top. When the first connection portion ND11 is bent, the first display panel 11 located on the first circuit portion CB1 may face a first side surface 20a of the optical combiner 20. When the second connection portion ND21 is bent, the second display panel 12 located on the second circuit portion CB2 may face a second side surface 20b of the optical combiner 20. When the third connection portion ND31 is bent, the third display panel 13 located on the third circuit portion CB3 may face a third side surface 20c of the optical combiner 20. Accordingly, the first display panel 11 and the second display panel 12 may face each other.

In the display device 1 according to the present embodiments, as shown in FIG. 2, the first light output from the first display panel 11 may be incident on the first side surface 20a of the optical combiner 20, and may be reflected by the first reflective/transmissive film 21. The third light output from the third display panel 13 may be incident on the third side surface 20c of the optical combiner 20, and may be reflected by the second reflective/transmissive film 22. The second light output from the second display panel 12 may be incident on the second side surface 20b of the optical combiner 20, and may pass through it as it is. The first to third lights may be focused by the optical combiner 20 so that they may be output as white light.

That is, mono-color lights emitted from the first to third display panels 11, 12, and 13, respectively, are focused in the optical combiner 20 to implement a display of multi-color light.

Because the first to third connection portions ND11, ND21, and ND31 form the cutout patterns, respectively, arrangement accuracy with the side surfaces of the optical combiner 20 may be increased. Accordingly, the first to third lights may be likely to be incident on the optical combiner 20 (e.g., vertically).

In addition, as the first to third display panels 11, 12, and 13 are located on the single circuit board CB, the size of the display device 1 may be reduced, and the display device 1 may be lighter. In addition, the cost of the circuit board CB may be reduced because only one circuit board is used.

Referring to FIG. 20, cover films CVLa and CVLb may be further located on the first circuit portion CB1, the second circuit portion CB2, and the third circuit portion CB3.

The cover films CVLa and CVLb may include a top cover film CVLa attached to the upper surface of the circuit board CB, and a rear cover film CVLb attached to the rear surface of the circuit board CB.

In the first circuit portion CB1, the top cover film CVLa may be located on the upper surface of the first insulating layer DL1 of the first circuit board layer CBL1, and the rear cover film CVLb may be located on the rear surface of the first base layer BL1 of the first circuit board layer CBL1.

In the second circuit CB2, the top cover film CVLa may be located on the upper surface of the second insulating layer DL2 of the second circuit board layer CBL2, and the rear cover film CVLb may be located on the rear surface of the first base layer BL1 of the first circuit board layer CBL1.

In the third circuit CB3, the top cover film CVLa may be located on the upper surface of the third insulating layer DL3 of the third circuit board layer CBL3, and the rear cover film CVLb may be located on the rear surface of the first base layer BL1 of the first circuit board layer CBL1.

When an adhesive member is further attached to the top cover film CVLa, the semiconductor circuit layers 110, 120, and 130 of the first to third display panels 11, 12, and 13 may be located on the adhesive member.

The cover films CVLa and CVLb may be insulating films for protecting the circuits, and may include an insulating polymer material such as polyimide.

Referring to FIGS. 21 and 22, the second non-display area NDA2 of the second display panel 12 may include a first common voltage supply area CVAb1, a second common voltage supply area CVAb2, a first pad area PDAb1, and a second pad area PDAb2. The second circuit portion CB2 of the circuit board CB may include a first circuit pad area CDAb1 and a second circuit pad area CDAb2.

The first pad area PDAb1 may include first pads PDb1 connected to the second circuit portion CB2 of the circuit board CB. The first circuit pad area CDAb1 may include first circuit pads CDb1 connected to the second display panel 12.

The first pads PDb1 of the second display panel 12 and the pad connection electrode PDE may be electrically connected to each of the first circuit pads CDb1 of the second circuit portion CB2 through a conductive connection member, such as a wire WR.

In addition, the first circuit pads CDb1 of the first circuit pad area CDAb1 may be connected to the plurality of second conductive lines RL2 included in the second conductive layer CL2 of the second circuit portion CB2.

Accordingly, the second conductive line RL2, the first circuit pad CDb1, the wire WR, the pad connection electrode PDE, and the first pad PDb1 may be electrically connected to each other. The second display panel 12 may receive an external driving signal through the plurality of second conductive lines RL2.

Because the first display panel 11 and the third display panel 13 are similar to the second display panel 12, FIG. 21 shows only an enlarged view of area C2, while omitting an enlarged view of area C1 of the first display panel 11 and an enlarged view of area C3 of the third display panel 13.

In the display device 1 according to the present embodiments, the first to third display panels 11, 12, and 13 are formed on the single circuit board and a driving signal may be applied to each of them, even without employing separate circuit boards for the display panels 11, 12, and 13. Accordingly, the display device 1 may display images of multi-color light using the display panels of mono-color light.

Figure 23:
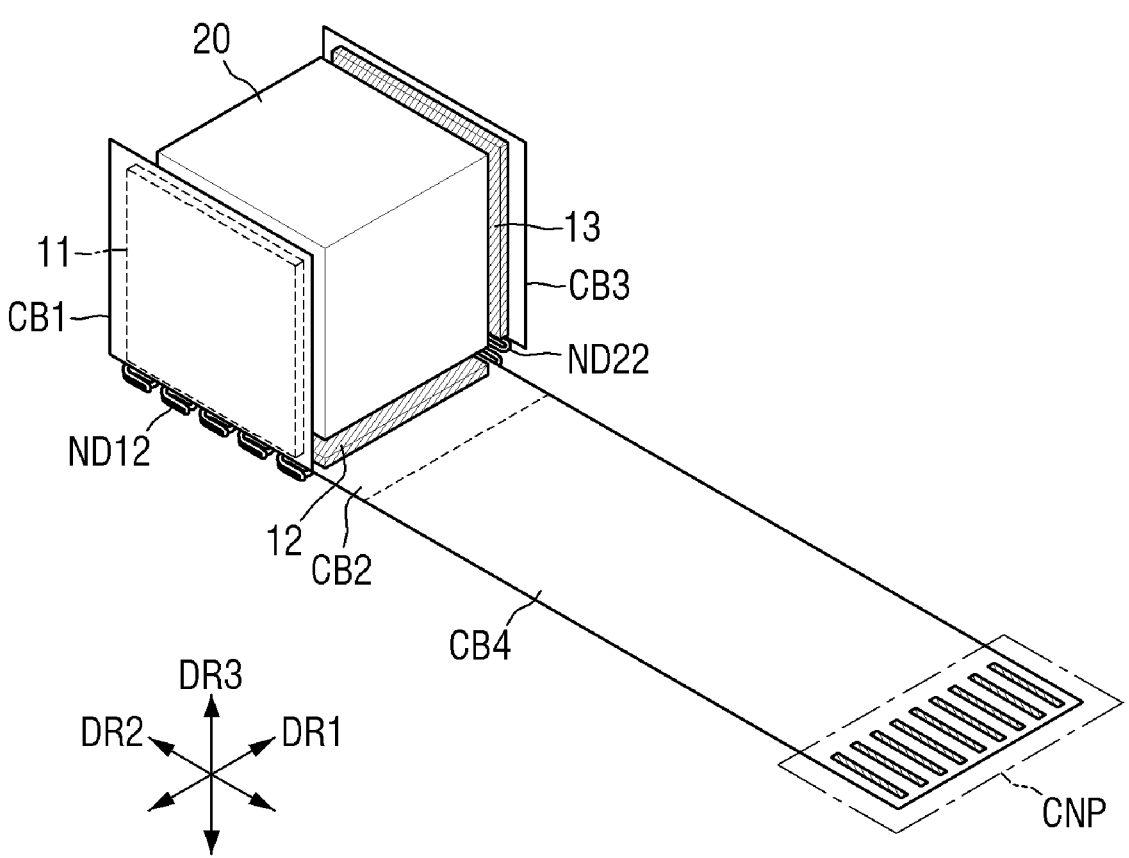
FIG. 23 is a side view of a display device according to yet other embodiments of the disclosure.
Figure 24:
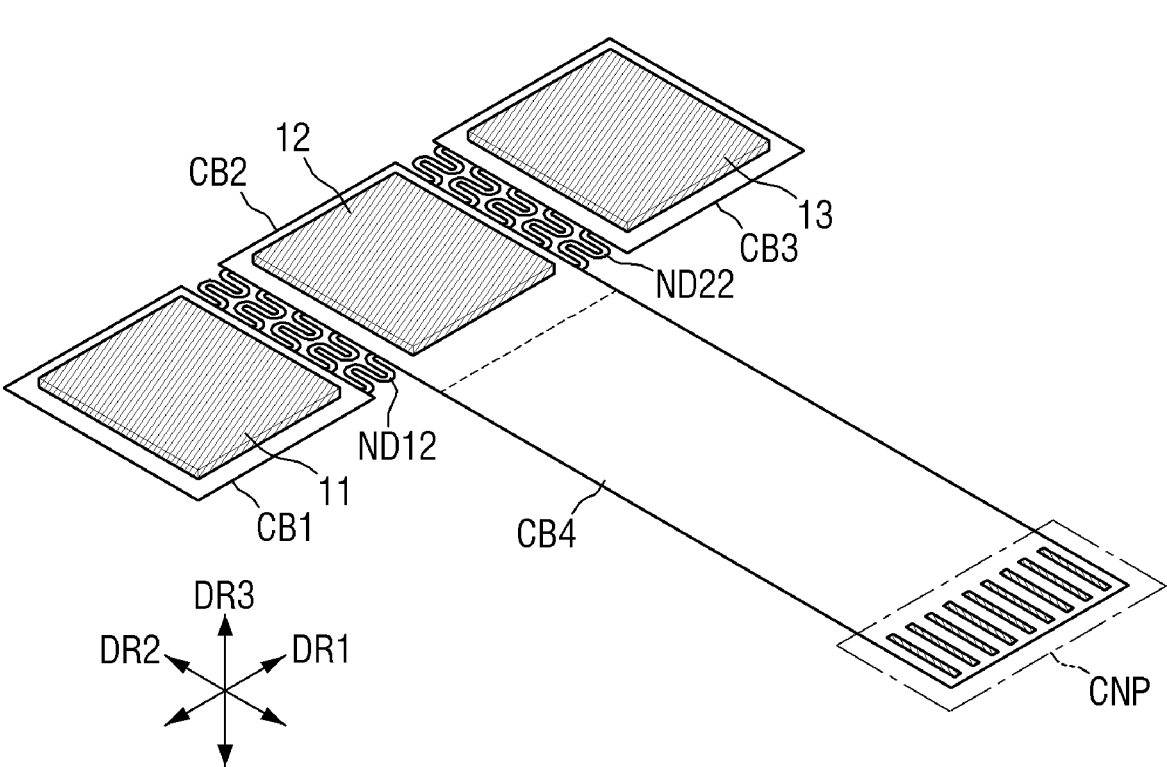
FIG. 24 is a perspective view of a side of a display device according to yet other embodiments of the disclosure.

Hereinafter, a display device according to yet other embodiments will be described with reference to FIGS. 23 and 24. FIG. 23 is a side view of a display device according to yet other embodiments of the disclosure. FIG. 24 is a perspective view of a side of a display device according to yet other embodiments of the disclosure.

First to third display panels 11, 12, and 13 are located on a single circuit board CB in a display device 1, and first and second connection portions ND12 and ND22 form cutout patterns according to the present embodiments as in the above-described embodiments corresponding to FIGS. 17 to 22, with a difference in that first to fourth circuit portions CB1, CB2, CB3, and CB4 are arranged in a T shape.

The fourth circuit portion CB4 may be located on one side of the second circuit portion CB2, and may be connected to the second circuit portion CB2 without the connection portions having the cutout patterns to form the single circuit board CB.

Accordingly, the first circuit portion CB1, the second circuit portion CB2, and the third circuit portion CB3 may be arranged in the first direction DR1, and the second circuit portion CB2 and the fourth circuit portion CB4 may be arranged in the second direction DR2 that is substantially perpendicular to the first direction DR1. In other words, the first to fourth circuit portions CB1, CB2, CB3, and CB4 may be arranged in a T shape.

Because the first and second connection portions ND12 and ND22 form the cutout patterns, respectively, in the display device 1 according to the present embodiments, arrangement accuracy with the side surfaces of the optical combiner 20 may be increased. Accordingly, the first to third lights may be likely to be incident on the optical combiner 20 (e.g., vertically).

In addition, because the first to fourth circuit portions CB1, CB2, CB3, and CB4 are arranged in the T shape, the degree of freedom in arrangement of the circuit board CB may be increased.

Figure 25:
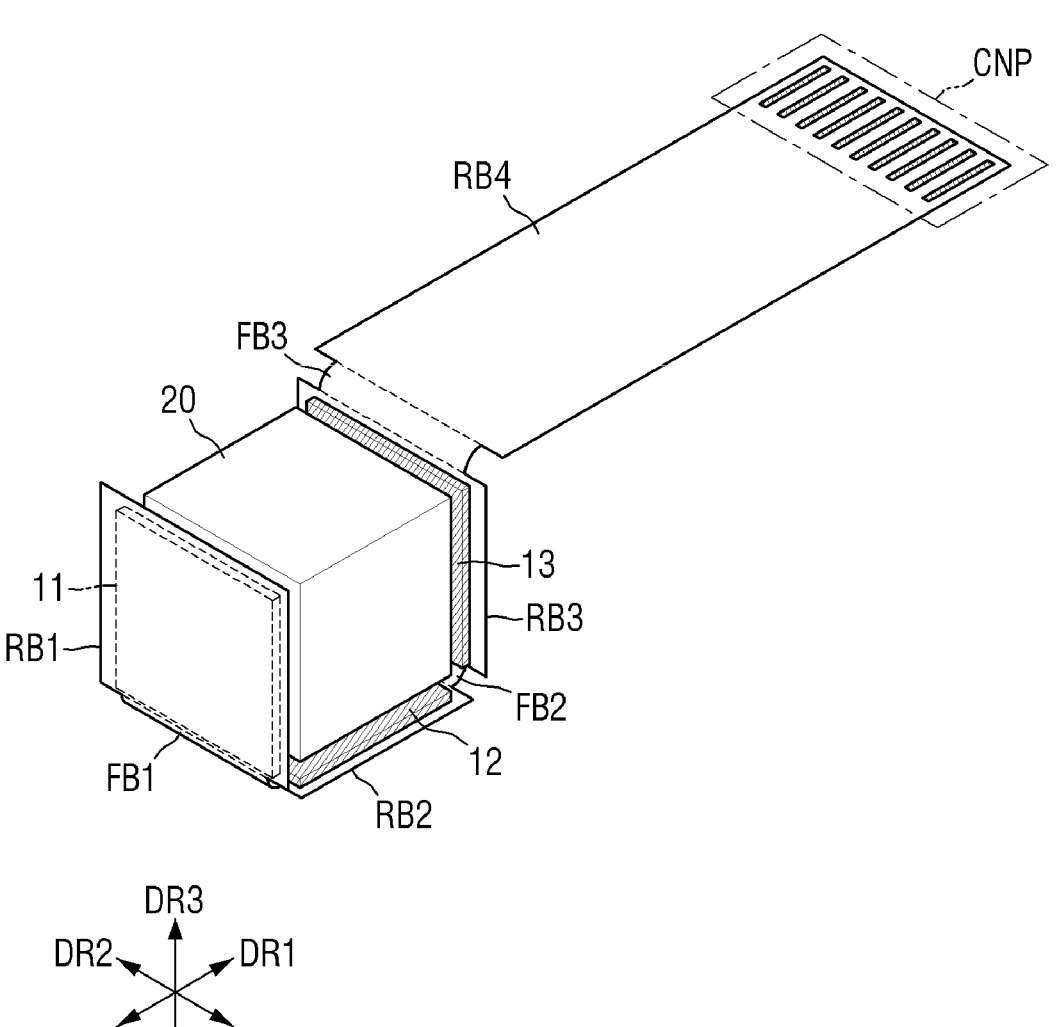
FIG. 25 is a side view of a display device according to yet other embodiments of the disclosure.
Figure 26:
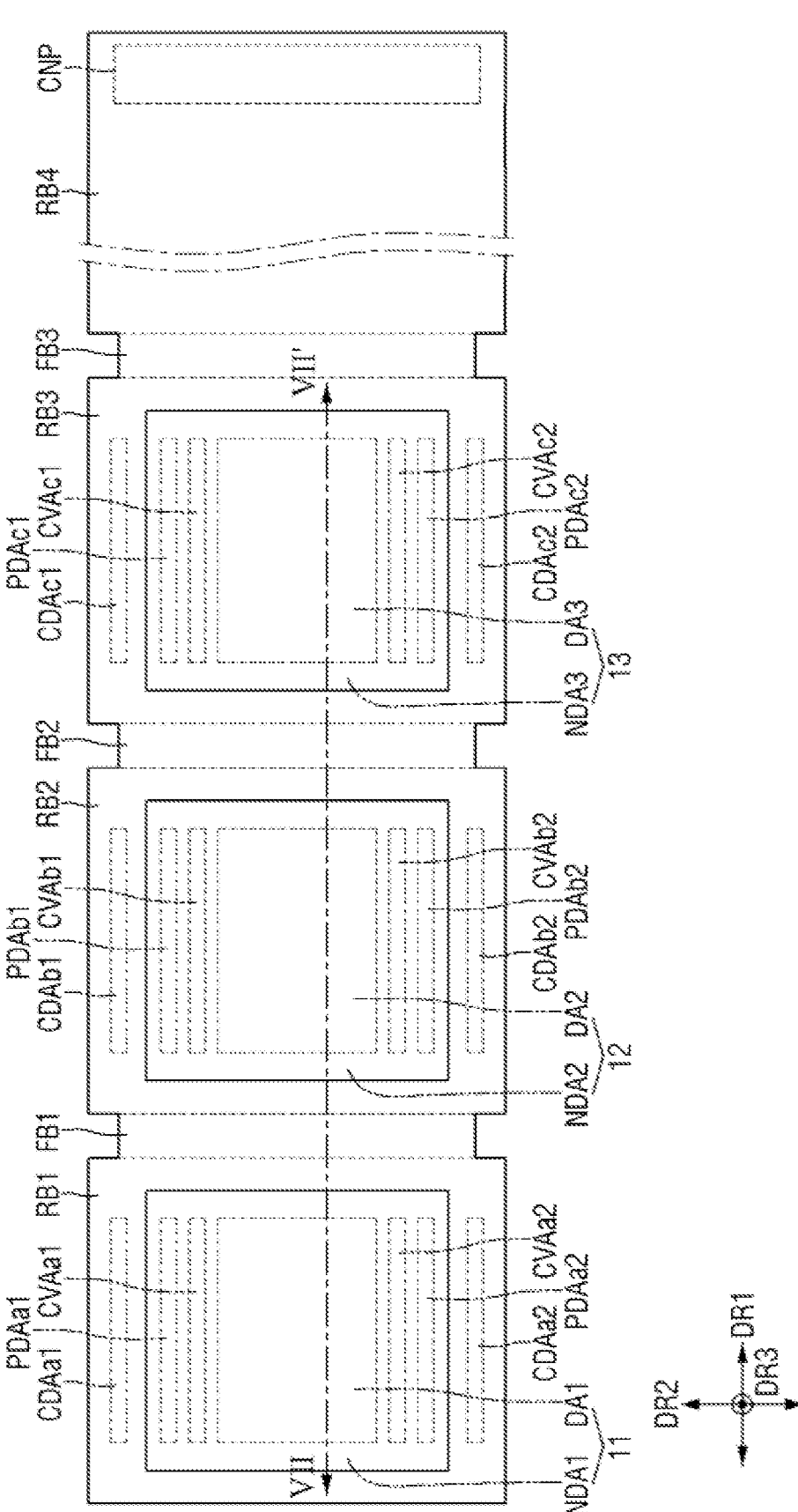
FIG. 26 is a plan view of a display device according to yet other embodiments of the disclosure.
Figure 27:
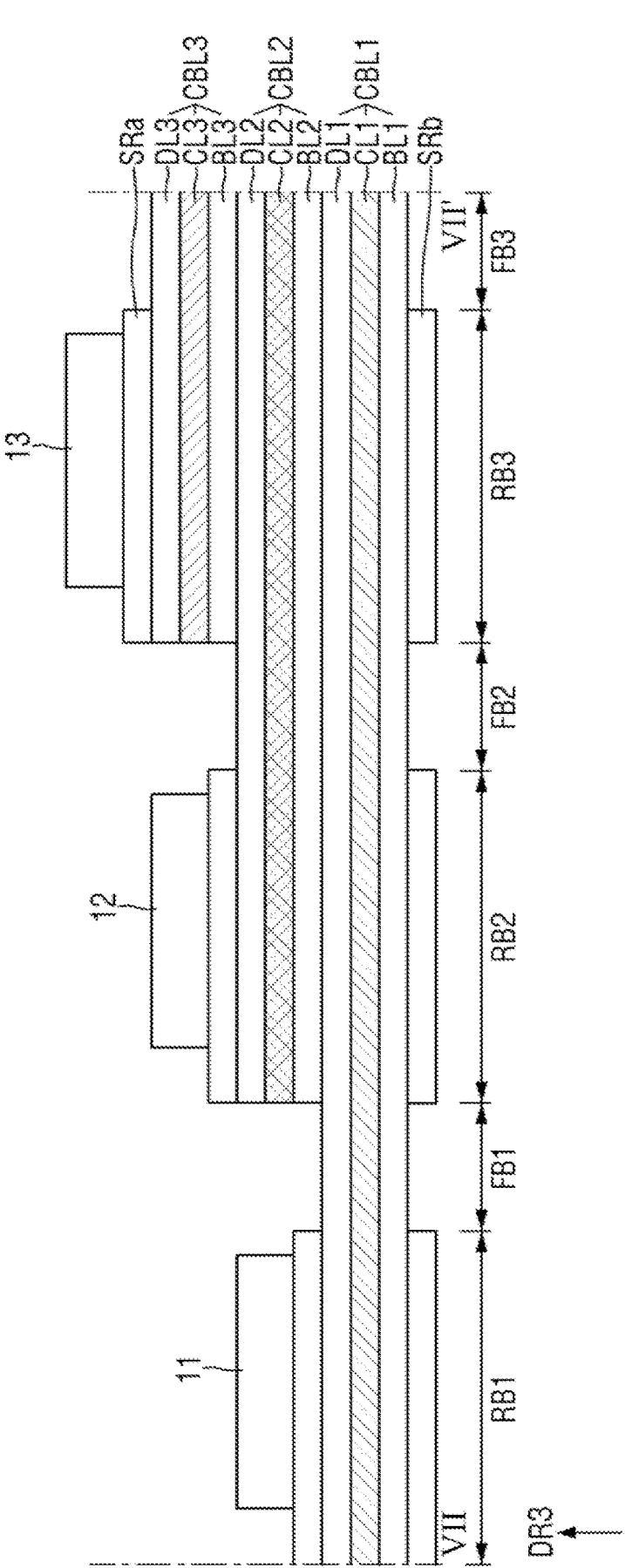
FIG. 27 is a cross-sectional view showing an example of the display panel taken along the line VII-VII' of FIG. 26.

Hereinafter, a display device according to yet other embodiments will be described with reference to FIGS. 25 to 27. FIG. 25 is a side view of a display device according to yet other embodiments of the disclosure. FIG. 26 is a plan view of a display device according to yet other embodiments of the disclosure. FIG. 27 is a cross-sectional view showing an example of the display panel taken along the line VII-VII' of FIG. 26.

First to third display panels 11, 12, and 13 are located on a single circuit board CB in a display device 1 according to the present embodiments as in the above-described embodiments, with a difference in that first to fourth connection portions are rigid portions while first to third connection portions are flexible portions.

The circuit board CB may include a first rigid portion RB1, a second rigid portion RB2, a third rigid portion RB3 and a fourth rigid portion RB4, and may include a first flexible portion FB1, a second flexible portion FB2, and a third flexible portion FB3 located therebetween.

A first display panel 11 may be located on the first rigid portion RB1 of the circuit board CB, similar to the first circuit portion CB1 of FIG. 4. The first rigid portion RB1 may be adjacent to a first side surface 20a of an optical combiner 20. The first rigid portion RB1, the first display panel 11, and the first side surface 20a of the optical combiner 20 may be sequentially arranged.

A second display panel 12 may be located on the second rigid portion RB2 of the circuit board CB, similar to the second circuit portion CB2 of FIG. 4. The second rigid portion RB2 may be adjacent to a second side surface 20b of the optical combiner 20. The second rigid portion RB2, the second display panel 12, and the second side surface 20b of the optical combiner 20 may be sequentially arranged.

A third display panel 13 may be located on the third rigid portion RB3 of the circuit board CB, similar to the third circuit portion CB3 of FIG. 4. The third rigid portion RB3 may be adjacent to a third side surface 20c of the optical combiner 20. The third rigid portion RB3, the third display panel 13, and the third side surface 20c of the optical combiner 20 may be sequentially arranged.

The fourth rigid portion RB4 of the circuit board CB may include a connector coupler CNP connected to an external connector.

Referring to FIG. 27, the first to fourth rigid portions RB1, RB2, RB3, and RB4 may further include rigid support members SRa and SRb.

The rigid support members SRa and SRb may include an upper rigid support member SRa attached to an upper portion of the circuit board CB, and a lower rigid support member SRb attached to a lower portion of the circuit board CB.

In the first rigid portion RB1, the upper rigid support member SRa may be located above the first insulating layer DL1 of the first circuit board layer CBL1, and the lower rigid support member SRb may be located under the first base layer BL1 of the first circuit board layer CBL1.

In the second rigid portion RB2, the upper rigid support member SRa may be located above the second insulating layer DL2 of the second circuit board layer CBL2, and the lower rigid support member SRb may be located under the first base layer BL1 of the first circuit board layer CBL1.

In the third rigid portion RB3, the upper rigid support member SRa may be located above the third insulating layer DL3 of the third circuit board layer CBL3, and the lower rigid support member SRb may be located under the first base layer BL1 of the first circuit board layer CBL1.

The rigid support members SRa and SRb may include, but are not limited to, a prepreg layer produced by impregnating a glass substrate with an epoxy resin or the like. The rigid support members SRa and SRb may impart rigidity to the first to fourth rigid portions RB1, RB2, RB3, and RB4. Accordingly, the first to third display panels 11, 12, and 13 may be mounted, and the elements may be supported more reliably.

The first to third flexible portions FB1, FB2, and FB3 of the circuit board CB may have a flexible property so that it is suitably able to be bent or folded when viewed from the top. The first flexible portion FB1 may be located between the first rigid portion RB1 and the second rigid portion RB2, the second flexible portion FB2 may be between the second rigid portion RB2 and the third rigid portion RB3, and the third flexible portion FB3 may be located between the third rigid portion RB3 and fourth rigid portion RB4.

Because the first to third flexible portions FB1, FB2, and FB3 have the flexible property, the degree of freedom of arrangement of the first to third display panels 11, 12, and 13 located on the first to third rigid portions RB1, RB2, and RB3 may be improved. Accordingly, the lines may be arranged in the display panel in a three-dimensional array. That is to say, the signal connectivity of the conductive lines may be improved.

The display device 1 according to the present embodiments uses the rigid-flexible circuit board (RF-PCB) including the rigid portions, on which the elements are mounted, and including the flexible portions connecting the signal lines, so that the display device 1 may become smaller and lighter and may be suitably carried.

Figure 28:
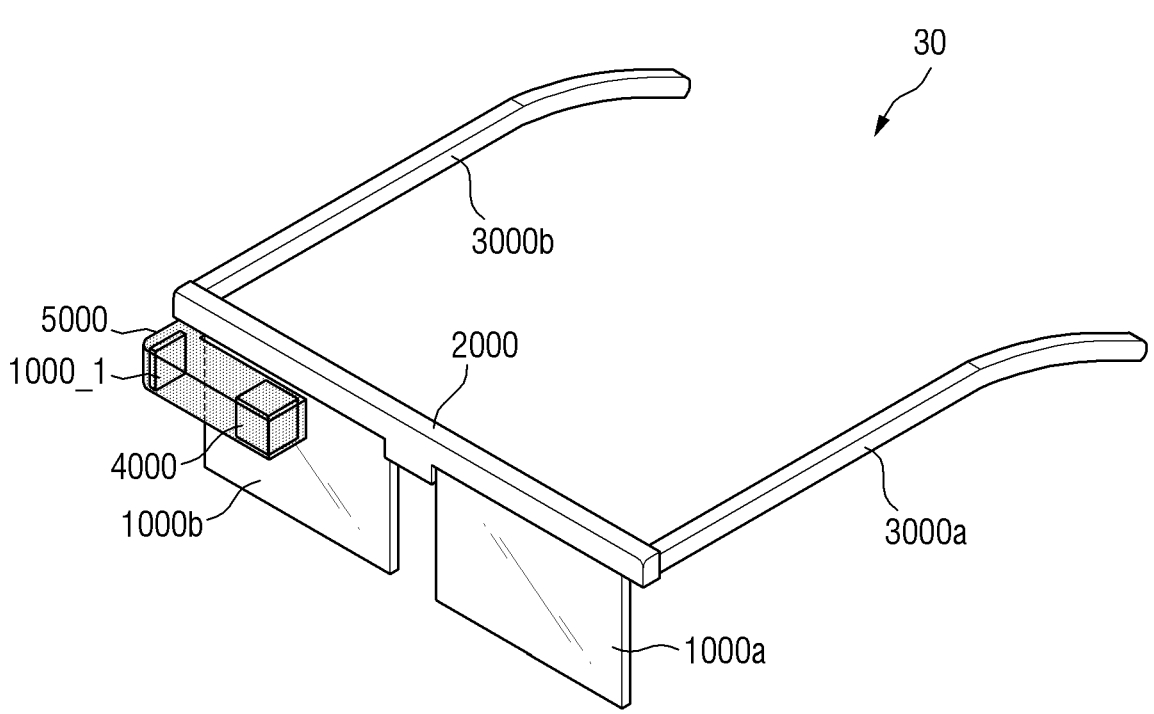
FIG. 28 is a view showing an example of a virtual reality device including a display device according to some embodiments.

FIG. 28 is a view showing an example of a virtual reality device including a display device according to some embodiments. FIG. 28 shows a virtual reality device 30 employing a display device 1000_1 according to some embodiments.

Referring to FIG. 28, the virtual reality device 30 according to some embodiments may be a device in the form of glasses. The virtual reality device 30 according to some embodiments of the disclosure may include the display device 1000_1, a left eye lens 1000a, a right eye lens 1000b, a support frame 2000, eyeglass temples 3000a and 3000b, a reflective member 4000, and a display case 5000.

Although FIG. 28 shows the virtual reality device 30 including the eyeglass temples 3000a and 3000b, a head mounted display with a head strap may be employed as the virtual reality device 30 according to some embodiments of the disclosure instead of the eyeglass temples 3000a and 3000b. That is to say, the virtual reality device 30 is not limited to that shown in FIG. 28, but may be applied in a variety of electronic devices in a variety of forms.

The display case 5000 may include the display device 1000_1 and the reflective member 4000. An image displayed on the display device 1000_1 may be reflected by the reflective member 4000, and may be provided to the user's right eye through the right eye lens 1000b. Accordingly, the user may watch a virtual reality image displayed on the display device 1000_1 through the right eye.

Although the display case 5000 is located at the right end of the support frame 2000 in the example shown in FIG. 28, the embodiments of the disclosure are not limited thereto. For example, the display case 5000 may be located at the left end of the support frame 2000. In such case, an image displayed on the display device 1000_1 is reflected by the reflective member 4000 and provided to the user's left eye through the left eye lens 1000a. Accordingly, the user may watch a virtual reality image displayed on the display device 1000_1 through the left eye. Alternatively, the display cases 5000 may be located at both the left and right ends of the support frame 2000, respectively. In such case, the user may watch a virtual reality image displayed on the display device 1000_1 through both the left and right eyes.

Figure 29:
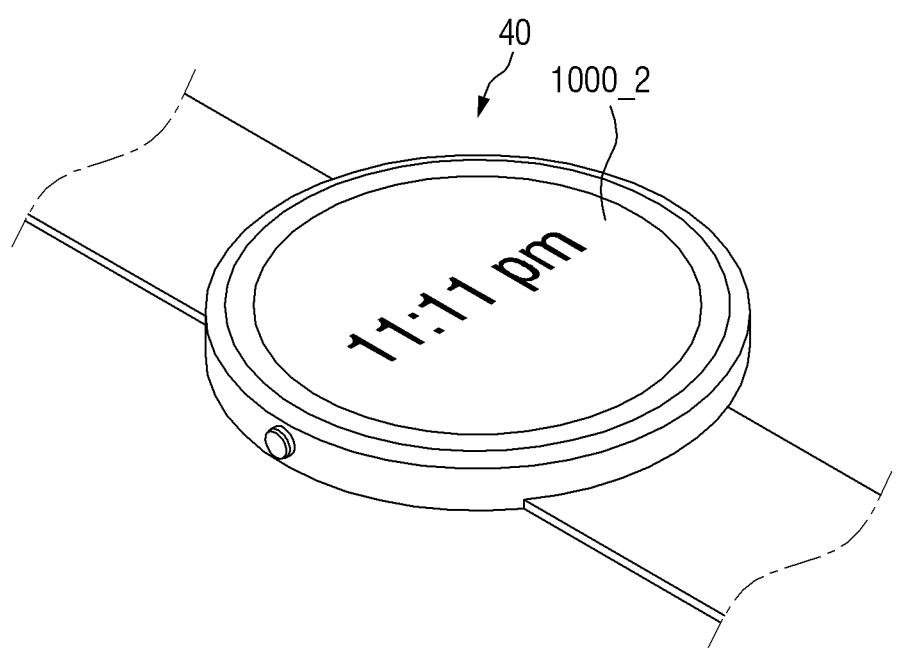
FIG. 29 is a view showing an example of a smart device including a display device according to some embodiments of the disclosure.

FIG. 29 is a view showing an example of a smart device including a display device according to some embodiments of the disclosure.

Referring to FIG. 29, a display device 1000_2 according to some embodiments may be applied to a smart watch 40 that is one of smart devices.

Figure 30:
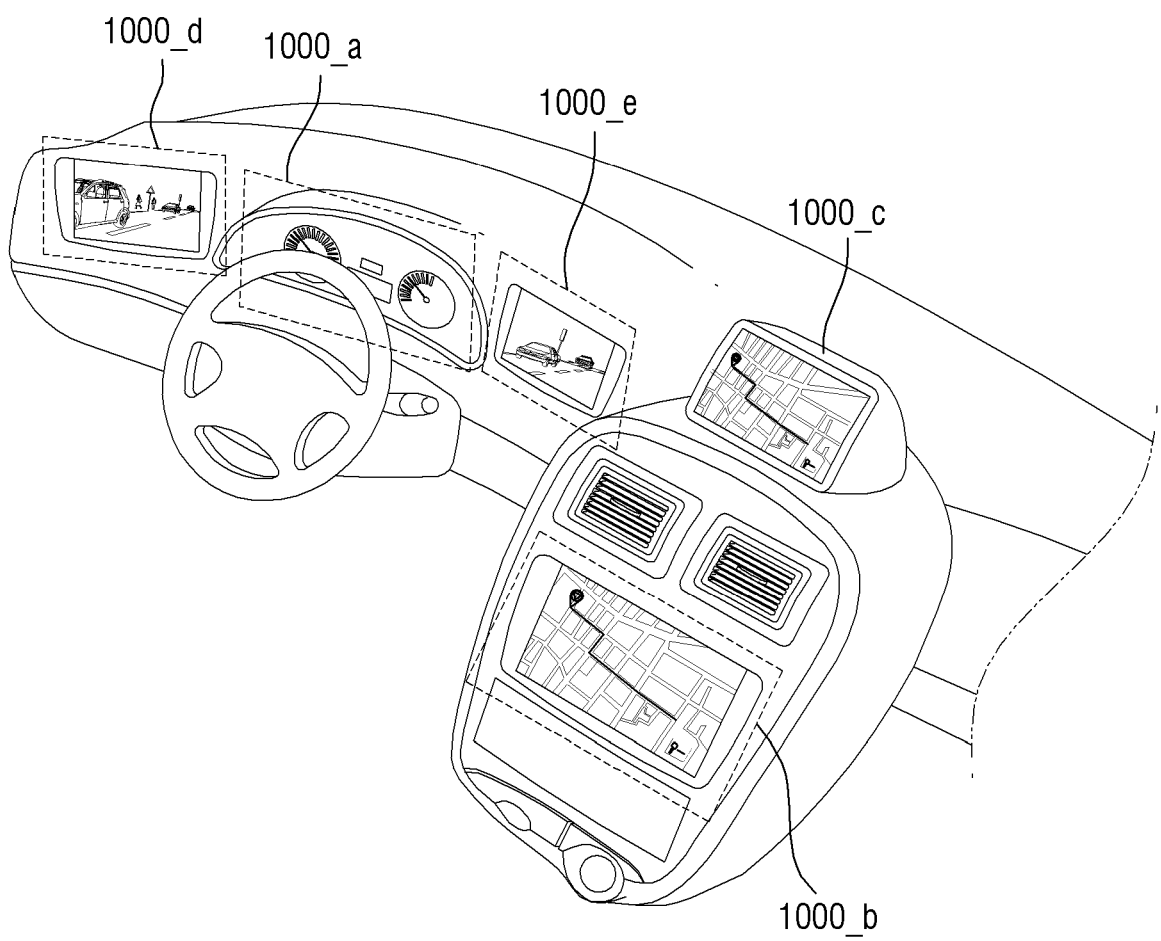
FIG. 30 is a view showing an example of an instrument cluster and a center fascia including display devices according to some embodiments.

FIG. 30 is a view showing an example of an instrument cluster and a center fascia including display devices according to some embodiments. FIG. 30 shows a vehicle in which display devices 1000_a, 1000_b, 1000_c, 1000_d, and 1000_e according to some embodiments are applied.

Referring to FIG. 30, the display devices 1000_a, 1000_b, and 1000_c according to some embodiments of the disclosure may be applied to the instrument cluster of a vehicle, may be applied to the center fascia of the vehicle, or may be applied to a center information display (CID) located on the dashboard of the vehicle. The display devices 1000_d and 1000_e according to some embodiments of the disclosure may be applied to room mirror displays, which may replace side mirrors of the vehicle.

Figure 31:
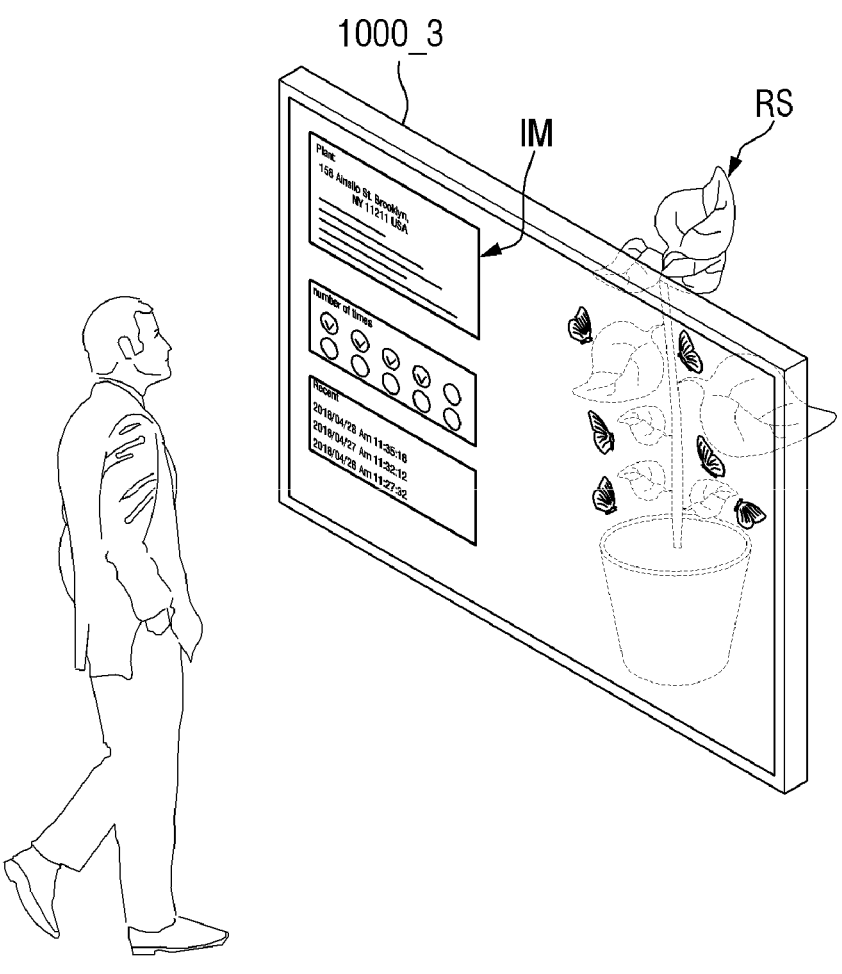
FIG. 31 is a view showing an example of a transparent display device including a transparent display device according to some embodiments.

FIG. 31 is a view showing an example of a transparent display device including a transparent display device according to some embodiments.

Referring to FIG. 31, a display device 1000_3 according to some embodiments may be applied to a transparent display device. The transparent display device may transmit light while displaying images IM. Therefore, a user located on the front side of the transparent display device may not only view the images IM displayed on the display device 1000_3, but also may view an object RS or the background located on the rear side of the transparent display device. When the display device 1000_3 is applied to the transparent display device, the first substrate SUB1 of the display device 1000_3 shown in FIGS. 12 to 14 may include a light-transmitting portion that may transmit light or may be made of a material that may transmit light.

Features of various embodiments of the disclosure may be combined partially or totally. As will be clearly appreciated by those skilled in the art, technically various interactions and operations are possible. Various embodiments may be practiced individually or in combination.

In concluding the detailed description, those skilled in the art will appreciate that many variations and modifications may be made to the embodiments without substantially departing from the present disclosure. Therefore, the disclosed embodiments of the present disclosure are used in a generic and descriptive sense only and not for purposes of limitation.

What is claimed is:

1. A display device comprising:
  a circuit board comprising a first circuit portion, a second circuit portion, a third circuit portion, a fourth circuit portion, a bendable first connection portion, and a bendable second connection portion, a thickness of the first circuit portion, a thickness of the second circuit portion, and a thickness of the third circuit portion being different from one another due to different respective numbers of layers therein, such that the first circuit portion, the second circuit portion, and the third circuit portion are configured to receive different respective signals;

a first display panel on the first circuit portion, and configured to emit a first light;

a second display panel on the second circuit portion, and configured to emit a second light;

a third display panel on the third circuit portion, and configured to emit a third light;

an optical combiner configured to combine the first light, the second light, and the third light to output a light;

a first circuit board layer in the first circuit portion, the second circuit portion, the third circuit portion, the first connection portion, and the second connection portion;

a second circuit board layer in the second circuit portion, the third circuit portion, and the second connection portion; and a third circuit board layer in the third circuit portion, wherein the first circuit board layer comprises a first base layer, a first conductive layer on the first base layer and comprising first conductive lines, and a first insulating layer on the first conductive layer, wherein the second circuit board layer comprises a second base layer, a second conductive layer on the second base layer and comprising second conductive lines, and a second insulating layer on the second conductive layer, wherein the third circuit board layer comprises a third base layer, a third conductive layer on the third base layer and comprising third conductive lines, and a third insulating layer on the third conductive layer, wherein the fourth circuit portion comprises a first conductive pattern is connected to the first conductive layer through a first via hole and a second conductive pattern is connected to the second conductive layer through a second via hole, and wherein a height of the first via hole is different from a height of the second via hole.

2. The display device of claim 1, wherein the first connection portion is between the first circuit portion and the second circuit portion, and wherein the second connection portion is between the second circuit portion and the third circuit portion.

3. The display device of claim 1, wherein the optical combiner comprises:

a first reflective/transmissive film that is configured to reflect the first light of the first display panel, and that is configured to transmit the second and third lights; and a second reflective/transmissive film that is configured to reflect the third light of the third display panel, and that is configured to transmit the first light and the second light.

4. The display device of claim 3, wherein the first display panel is on a first side surface of the optical combiner, wherein the second display panel is on a second side surface of the optical combiner, and wherein the third display panel is on a third side surface of the optical combiner facing the first side surface.

5. The display device of claim 1, wherein the thickness of the first circuit portion is smaller than the thickness of the second circuit portion, and the thickness of the second circuit portion is less than the thickness of the third circuit portion.

6. The display device of claim 1, wherein the first circuit board layer is not covered by the second circuit board layer, but is exposed, in the first circuit portion and the first connection portion, and wherein the second circuit board layer is not covered by the third circuit board layer, but is exposed, in the second circuit portion and the second connection portion.

7. The display device of claim 1, wherein the first display panel is on the first circuit board layer, the second display panel is on the second circuit board layer, and the third display panel is on the third circuit board layer.

8. A display device comprising:

a circuit board comprising:

a first circuit portion;

a second circuit portion;

a third circuit portion;

a bendable first connection portion between the first circuit portion and the second circuit portion; and a bendable second connection portion between the second circuit portion and the third circuit portion;

a first display panel on the first circuit portion, and configured to emit a first light;

a second display panel on the second circuit portion, and configured to emit a second light;

a third display panel on the third circuit portion, and configured to emit a third light;

an optical combiner configured to combine the first light, the second light, and the third light to output a light;

a first circuit board layer in the first circuit portion, the second circuit portion, the third circuit portion, the first connection portion, and the second connection portion, and comprising a first base layer, a first conductive layer on the first base layer and comprising first conductive lines, and a first insulating layer on the first conductive layer;

a second circuit board layer in the second circuit portion, the third circuit portion, and the second connection portion, and comprising a second base layer, a second conductive layer on the second base layer and comprising second conductive lines, and a second insulating layer on the second conductive layer; and a third circuit board layer in the third circuit portion, and comprising a third base layer, a third conductive layer on the third base layer and comprising third conductive lines, and a third insulating layer on the third conductive layer, wherein the circuit board further comprises a fourth circuit portion defining:

a first via hole penetrating through the first insulating layer, the second insulating layer, the second conductive layer, the third insulating layer, and the third conductive layer;

a second via hole penetrating through the second insulating layer, the third insulating layer, and the third conductive layer; and a third via hole penetrating through the third insulating layer.

9. The display device of claim 2, wherein the first connection portion and the second connection portion have a serpentine structure when viewed from top.

10. The display device of claim 2, wherein the first circuit portion, the second circuit portion, and the third circuit portion further comprise a rigid support member, and wherein the first connection portion and the second connection portion are flexible.

* * * * *